(12) United States Patent
Yamamoto et al.

(10) Patent No.: US 7,618,768 B2
(45) Date of Patent: Nov. 17, 2009

(54) METHOD OF FORMING MICROPATTERN, METHOD OF MANUFACTURING OPTICAL RECORDING MEDIUM MASTER COPY, OPTICAL RECORDING MEDIUM MASTER COPY, OPTICAL RECORDING MEDIUM STAMPER, AND OPTICAL RECORDING MEDIUM

(75) Inventors: Masaki Yamamoto, Nara (JP); Go Mori, Nara (JP); Hideharu Tajima, Izumi (JP); Nobuyuki Takamori, Kitakatsuragi-gun (JP); Michinobu Mieda, Shiki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 516 days.

(21) Appl. No.: 10/912,028

(22) Filed: Aug. 4, 2004

(65) Prior Publication Data

US 2005/0032001 A1 Feb. 10, 2005

(30) Foreign Application Priority Data

Aug. 4, 2003 (JP) ............................. 2003-205793
May 19, 2004 (JP) ............................. 2004-149653

(51) Int. Cl.
*G03F 7/00* (2006.01)
(52) U.S. Cl. ...................................... 430/321; 430/322
(58) Field of Classification Search ....................... None
See application file for complete search history.

(56) References Cited

U.S. PATENT DOCUMENTS

| 3,395,433 | A | * | 8/1968 | Kodaira et al. ................. 432/59 |
| 4,565,772 | A |   | 1/1986 | Takeoka et al. |
| 4,758,094 | A | * | 7/1988 | Wihl et al. ................... 356/394 |
| 4,845,000 | A |   | 7/1989 | Takeoka et al. |
| 5,043,251 | A | * | 8/1991 | Sonnenschein et al. ...... 430/297 |
| 5,130,225 | A | * | 7/1992 | Uetani ......................... 430/191 |
| 5,278,576 | A | * | 1/1994 | Kaszczuk et al. .......... 346/135.1 |
| 5,283,159 | A | * | 2/1994 | Norton et al. ........... 430/270.15 |

(Continued)

FOREIGN PATENT DOCUMENTS

EP 0 785 544 * 7/1997

(Continued)

OTHER PUBLICATIONS

Clariant Product Data Sheet, product "AZ-5214E".*

(Continued)

*Primary Examiner*—Mark F Huff
*Assistant Examiner*—Anna L Verderame
(74) *Attorney, Agent, or Firm*—Edwards Angell Palmer & Dodge LLP; David G. Conlin; William J. Daley, Jr.

(57) ABSTRACT

By using an existing, relatively inexpensive manufacturing device, micropatterns (e.g. guiding grooves, prepits) having such track pitch and pit pitch that are smaller than the diameter of a light spot are formed more finely. There are provided at least two layers, i.e. (i) a resin substrate and (ii) a depressed part inducing layer made of dielectric material or metal oxide. A light beam is radiated and focused onto the depressed part inducing layer so as to form pit parts and/or guiding grooves on irradiated parts of the resin substrate. The depressed part inducing layer is then removed, so as to expose the pit parts and/or guiding grooves.

29 Claims, 24 Drawing Sheets

U.S. PATENT DOCUMENTS

| | | | | |
|---|---|---|---|---|
| 5,312,718 | A | * | 5/1994 | Ledieu et al. ............... 430/320 |
| 5,320,789 | A | | 6/1994 | Nishii et al. |
| 5,352,562 | A | * | 10/1994 | Takahashi et al. ........... 430/253 |
| 5,695,907 | A | * | 12/1997 | Chang ........................ 430/201 |
| 6,117,613 | A | * | 9/2000 | Kawauchi et al. ........ 430/270.1 |
| 6,228,562 | B1 | * | 5/2001 | Kawanishi .................. 430/321 |
| 6,783,915 | B2 | * | 8/2004 | Pokorny et al. ............. 430/200 |
| 6,814,897 | B2 | * | 11/2004 | Morita ...................... 264/1.33 |
| 7,351,516 | B2 | * | 4/2008 | Kato et al. ............. 430/270.13 |
| 2001/0055688 | A1 | * | 12/2001 | Katsumura et al. .......... 428/432 |
| 2002/0115023 | A1 | | 8/2002 | Hirokane et al. |
| 2002/0182546 | A1 | * | 12/2002 | Konishi et al. .............. 430/321 |
| 2003/0090991 | A1 | | 5/2003 | Poupinet et al. |
| 2003/0150340 | A1 | * | 8/2003 | Yamamoto et al. .......... 101/127 |
| 2003/0178229 | A1 | * | 9/2003 | Toyoda et al. ............... 174/261 |
| 2005/0117505 | A1 | | 6/2005 | Takamori et al. |
| 2005/0170295 | A1 | | 8/2005 | Hirokane et al. |
| 2006/0269872 | A1 | * | 11/2006 | Miura ................... 430/270.12 |

FOREIGN PATENT DOCUMENTS

| | | | |
|---|---|---|---|
| JP | 53-88530 A | | 8/1978 |
| JP | 57-127938 A | | 8/1982 |
| JP | 57-157790 A | | 9/1982 |
| JP | 57-208646 A | | 12/1982 |
| JP | 58-56895 A | | 4/1983 |
| JP | 59-119549 A | | 7/1984 |
| JP | 1-296442 A | | 11/1989 |
| JP | 402245321 | * | 10/1990 |
| JP | 2-273339 | | 11/1990 |
| JP | 4-285739 A | | 10/1992 |
| JP | 5-339396 A | | 12/1993 |
| JP | 08 099477 | * | 4/1996 |
| JP | 09-044847 | | 2/1997 |
| JP | 10-319608 A | | 12/1998 |
| JP | 11-053773 A | | 2/1999 |
| JP | 02000021031 | * | 1/2000 |
| JP | 2001-250280 A | | 9/2001 |
| JP | 2002-184045 | | 6/2002 |
| JP | 2002-245686 A | | 8/2002 |
| JP | 2002-334483 | | 11/2002 |
| JP | 2002-365806 | * | 12/2002 |
| JP | 2003115138 | * | 4/2003 |
| JP | 2003-315988 | | 11/2003 |
| JP | 2003-535422 A | | 11/2003 |
| WO | WO-03/075268 A1 | | 9/2003 |

OTHER PUBLICATIONS

Translation of JP 08 099477(Apr. 1996).*

* cited by examiner

METHOD OF FORMING MICROPATTERN, METHOD OF MANUFACTURING OPTICAL RECORDING MEDIUM MASTER COPY, OPTICAL RECORDING MEDIUM MASTER COPY, OPTICAL RECORDING MEDIUM STAMPER, AND OPTICAL RECORDING MEDIUM

This nonprovisional application claims priorty under 35 U.S.C. § 119(a) on Patent Application No. 2003/205793 filed in Japan on Aug. 4, 2003, and Patent Application No. 2004/149653 filed in Japan on May 19, 2004. The entire contents of these applications are hereby incorporated by reference.

FIELD OF THE INVENTION

The present invention relates to (i) a method of forming a micropattern, employed for such purposes as manufacturing an optical recording medium master copy used to manufacture an optical recording medium (e.g. optical disk) in which information can be recorded at high density, and relates to (ii) a method of manufacturing an optical recording medium master copy, (iii) an optical recording medium master copy, (iv) an optical recording medium stamper, and (v) an optical recording medium.

BACKGROUND OF THE INVENTION

Recently, in order to increase the density of optical recording mediums (e.g. optical disks), microfabrication technologies for guiding grooves and prepits (often called "pits") of optical disks have been developed. In general, the guiding grooves and prepits are formed by so-called mastering process. In the mastering process, photoresist is applied onto a glass substrate, and a laser beam is radiated and focused onto the photoresist. By thus exposing and developing the photoresist, an optical disk master copy is fabricated.

The diameter of the light beam spot (hereinafter "light spot") of the focused laser beam is approximately $0.8\lambda/NA$, where $\lambda$ is the wavelength of the laser beam, and NA is the numerical aperture of the object lens that focuses the laser beam. In order to attain microfabrication of the guiding grooves and prepits of optical disks, it is necessary to reduce the diameter of the light spot. For this purpose, it is necessary to shorten the wavelength $\lambda$ and to increase NA.

However, NA is already 0.9 or higher, which is close to the current upper limit. Therefore, it is virtually difficult to reduce the diameter of the light spot by further increasing NA. On the other hand, if such $\lambda$ that is in the ultraviolet region is adopted (which means shortening the current wavelength), costs for optical members increase. In addition, this decreases the focal depth, thereby imposing stricter requirements to a master copy exposing device.

Among the methods of forming such guiding grooves and prepits that are smaller than the diameter of the light spot, there is an etching method. In the etching method, a photoresist pattern formed by development is used as a mask, and the material under the mask is etched. According to this method, such a part of the material under the mask that corresponds to the bottom width of the photoresist pattern is etched. Therefore, it is possible to form such guiding grooves and prepits that are equal to or smaller than the pattern formed in the photoresist.

Publication 1 discloses the following manufacturing method in which the photoresist pattern is used as a mask. First, a lower layer made of non-photosensitive water-soluble resin is formed on a glass substrate. Then, an intermediate layer made of inorganic material is formed on the lower layer. On the intermediate layer, an upper layer made of photosensitive resin is formed. Next, the upper layer is exposed and developed, so that a predetermined pattern is formed in the upper layer. At this time, reflecting the Gaussian distribution of the intensity of the light beam, the pattern in the upper layer is wider at an aperture than at a bottom.

Next, by etching the intermediate layer through the pattern in the upper layer, an aperture is formed. Then, optical ozone ashing is performed by using the intermediate layer as a mask. As a result, the pattern is transferred to the lower layer. Here, the width of the pattern in the upper layer determines the shape of the pattern in the lower layer. Therefore, it is possible to form such patterns of prepits and guiding grooves that are equal to or smaller than the diameter of the light spot. In addition, because the intermediate layer is made of inorganic material, the intermediate layer remains intact even after the upper layer (which is made of photosensitive resin) is etched by the optical ozone ashing. Therefore, such problems as the decay of an edge of a land part do not occur.

Another method of forming such guiding grooves and prepits that are smaller than the current diameter of the optical beam is disclosed in publication 2. The method of publication 2 is a method of recording information in an optical disk master copy. In this method, an electron beam is radiated onto the optical disk master copy, thereby forming a depressed part that represents recorded information.

(Publication 1) Japanese Publication for Unexamined Patent Application, Tokukai 2002-334483 (publication date: Nov. 22, 2002)

(Publication 2) Japanese Publication for Unexamined Patent Application, Tokukaihei 09-44847 (publication date: Feb. 14, 1997)

However, the methods of publications 1 and 2 for forming micropatterns such as guiding grooves and prepits have the following problems: (1) there is a limit in forming such guiding grooves and prepits whose track pitch and pit pitch are smaller than the diameter of the light spot, or (2) a very expensive manufacturing device is required.

The problem of the method of publication 1 is as follows. In order to increase the density, it is necessary to fabricate narrow guiding grooves and small pits, and to shorten (i) the track pitch, i.e. groove-to-groove or pit-to-pit distance in the radial direction, and (ii) the pit pitch, i.e. pit-to-pit distance in the in-track direction. If the track pitch or pit pitch is smaller than the diameter of the light spot, light spots overlap on the photoresist. The method of publication 1 requires a contrast between an exposed part and a non-exposed part, so as to use the upper layer (which is made of photosensitive resin) as a mask layer in etching the intermediate layer. However, if the light spots overlap, the necessary contrast cannot be attained. Therefore, as microfabrication advances, it becomes impossible to fabricate such track pitch and pit pitch that are smaller than the diameter of the light spot.

For example, according to publication 1, the patterns can be formed effectively if the track pitch satisfies TP>3/4×BD, where TP is the track pitch, and BD is the diameter of the light beam, i.e. the size (light spot diameter) of such a part where the light intensity is $1/e^2$ ($e \approx 2.718$) of the maximum value. On the other hand, such patterns that fall within the range of TP<3/4×BD cannot be formed. Therefore, if the diameter of the light spot is about 500 nm, it is impossible to form patterns whose TP is about 375 nm or smaller.

The problem of the method of publication 2 is as follows: a very expensive manufacturing device (e.g. a vacuum chamber for generating ultrahigh vacuum, an electron gun for emitting an electron beam) is required; that is, existing manufacturing devices cannot be used.

SUMMARY OF THE INVENTION

The present invention was made to solve the foregoing problems. An object of the present invention is therefore to provide (i) a method of forming a micropattern, employed to more finely form micropatterns (e.g. guiding grooves, prepits) whose track pitch and pit pitch are smaller than the diameter of the light spot, by using an existing, relatively inexpensive manufacturing device, and to provide (ii) a method of manufacturing an optical recording medium master copy, (iii) an optical recording medium master copy, (iv) an optical recording medium stamper, and (v) an optical recording medium.

As a result of diligent study aimed at attaining the foregoing object, the inventers of the present invention made the following finding and reached the present invention: by forming a lamination in which (i) a resin layer, (ii) an intermediate layer made of dielectric material or metal oxide, and (iii) a heat-absorbing layer that emits heat when irradiated by a light beam, are laminated in this order, and radiating and focusing a light beam onto the heat-absorbing layer of the lamination, a depressed part smaller than those formed by a conventional method can be formed in the resin layer, without requiring a special light beam emitting device.

As a result of further diligent study, the inventors of the present invention made the following finding and reached the present invention: (1) the heat-absorbing layer is not always necessary, and (2) by forming a lamination in which at least (i) a resin layer in which a depressed part is to be formed, and (ii) a depressed part inducing layer (equivalent to the intermediate layer) that is made of dielectric material or metal oxide and that induces formation of the depressed part are laminated, and radiating and focusing a light beam onto at least the depressed part inducing layer, a depressed part smaller than those formed by a conventional method can be formed in the resin layer by using a material that can be processed easily, without requiring a special light beam emitting device.

To solve the foregoing problems, a method of the present invention for forming a micropattern includes the steps of: forming a lamination by laminating at least (i) a resin layer and (ii) a depressed part inducing layer, which is made of dielectric material or metal oxide; and radiating and focusing a light beam onto at least the depressed part inducing layer of the lamination, so as to form a depressed part in the resin layer.

With this method, it is possible to form more finely than before such micropatterns that are smaller in size and shorter in interval than the diameter of a light beam (typically guiding grooves and prepits having such track pitch and pit pitch that are smaller than the diameter of a light beam) by using an existing, relatively inexpensive laser recording device using a light source of 240 nm to 700 nm.

However, the formation mechanism of such micropatterns is not known in detail. A presumable formation mechanism is discussed later in the Embodiments section.

A method of the present invention for forming the micropattern may include the steps of: forming a lamination by laminating at least (i) a resin layer, (ii) a depressed part inducing layer, which is made of dielectric material or metal oxide, and (iii) a heat-absorbing layer in this order; and radiating and focusing a light beam onto at least the heat-absorbing layer of the lamination, so as to form a depressed part in the resin layer. According to this method, heat is generated in the heat-absorbing layer when the light beam is radiated and focused onto at least the heat-absorbing layer, and the heat is transmitted to the depressed part inducing layer, which is made of dielectric material or metal oxide. As a result, such micropatterns that are finer and more uniform in shape are formed in the resin layer.

To solve the foregoing problems, a method of the present invention for manufacturing an optical recording medium master copy may include: a film-forming step, in which at least a depressed part inducing layer, which is made of dielectric material or metal oxide, is laminated on a resin substrate, which is a master copy; a light radiating step, in which a light beam is radiated and focused onto at least the depressed part inducing layer, so as to form a depressed part in the resin substrate; and a first peeling step, in which each layer on the resin substrate is removed so as to expose the depressed part.

With this method, as described in connection with the method of forming a micropattern, an optical recording medium master copy having guiding grooves and prepits (i) whose track pitch and pit pitch are smaller than the diameter of the light beam and (ii) that are finer than those formed by a conventional method can be manufactured by using an existing, relatively inexpensive laser recording device using a light source of 240 nm to 700 nm, and by using a material that can be processed easily.

To solve the foregoing problems, a method of the present invention for manufacturing an optical recording medium master copy includes: a film-forming step, in which at least (i) a resin layer and (ii) a depressed part inducing layer, which is made of dielectric material or metal oxide, are formed in this order on a master copy substrate, which is made of inorganic material; a light radiating step, in which a light beam is radiated and focused onto at least the depressed part inducing layer, so as to form a depressed part in the resin layer; and a first peeling step, in which each layer on the resin layer is removed so as to expose the depressed part.

With this method, like the foregoing method, an optical recording medium master copy having guiding grooves and prepits that are finer than those formed by a conventional method can be manufactured by using an existing laser recording device. In addition, because the resin layer is formed on the master copy substrate, the master copy substrate can rotate stably without wobbling in the light radiating step. As a result, it is possible to form the micropatterns more uniformly than in the arrangement of the resin substrate alone, thereby reducing the error rate.

To solve the foregoing problems, a method of the present invention for manufacturing an optical recording medium master copy includes: a film-forming step, in which at least (i) a resin layer and (ii) a depressed part inducing layer, which is made of dielectric material or metal oxide, are formed in this order on a master copy substrate, which is made of inorganic material; a light radiating step, in which a light beam is radiated and focused onto at least the depressed part inducing layer, so as to form a depressed part in the resin layer; a first peeling step, in which each layer on the resin layer is removed so as to expose the depressed part; and an etching step, in which the depressed part, which is formed in the resin layer, is transferred to the master copy substrate by etching.

With this method, like the foregoing method, an optical recording medium master copy having guiding grooves and prepits that are finer than those formed by a conventional method can be manufactured by using an existing laser recording device. In addition, because the resin layer is formed on the master copy substrate, the master copy substrate can rotate stably without wobbling in the light radiating step. As a result, it is possible to form the micropatterns more uniformly than in the arrangement of the resin substrate alone, thereby reducing the error rate.

Moreover, because the micropatterns (e.g. guiding grooves, prepits) formed in the resin layer, i.e. the micropatterns having such track pitch and pit pitch that are smaller than the diameter of the light beam, are transferred to the master copy substrate by etching, the micropatterns formed in the master copy substrate are more stable than the micropatterns formed in the resin layer.

The present invention also includes an optical recording medium master copy manufactured by the method of forming an optical recording medium master copy, an optical recording medium stamper manufactured by using the optical recording medium master copy, and an optical recording medium manufactured by using the stamper.

For a fuller understanding of the nature and advantages of the invention, reference should be made to the ensuing detailed description taken in conjunction with the accompanying drawings.

DESCRIPTION OF THE EMBODIMENTS

Embodiment 1

With reference to FIGS. 1 through 7, the following describes a method of forming a micropattern and a method of manufacturing an optical recording medium master copy that are one embodiment of the present invention.

Figure 1:
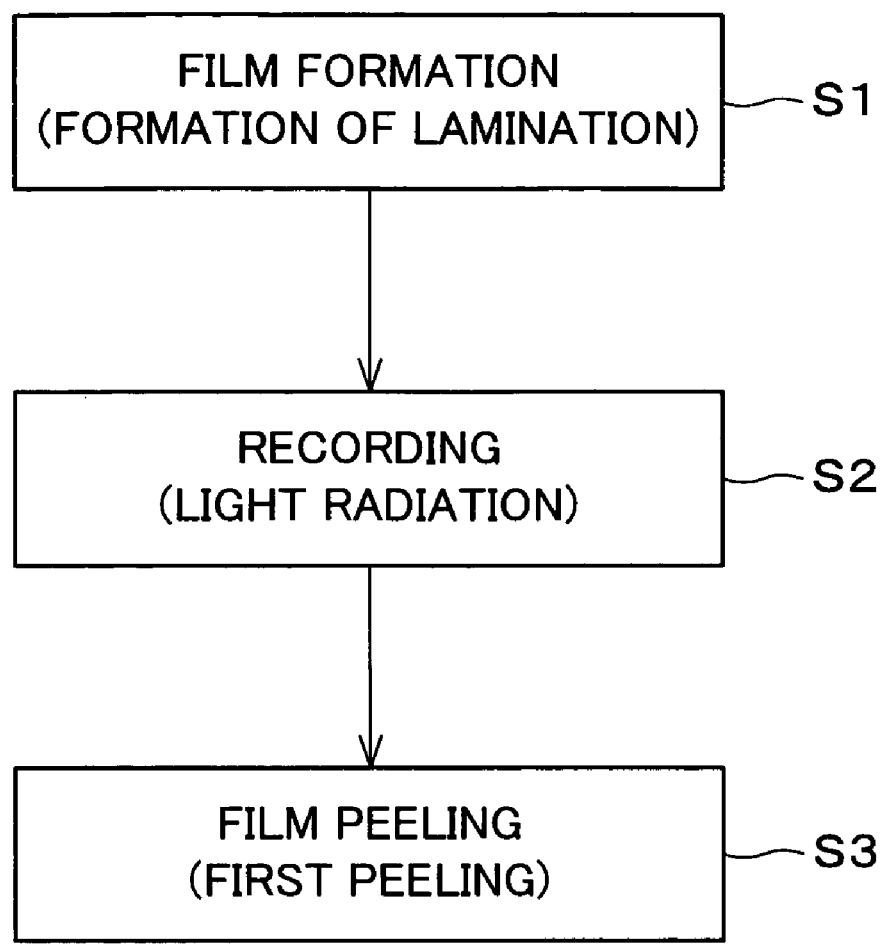
FIG. 1 is a flowchart explaining a method of forming a micropattern and a method of manufacturing an optical recording medium master copy that are of one embodiment of the present invention.
Figure 2:
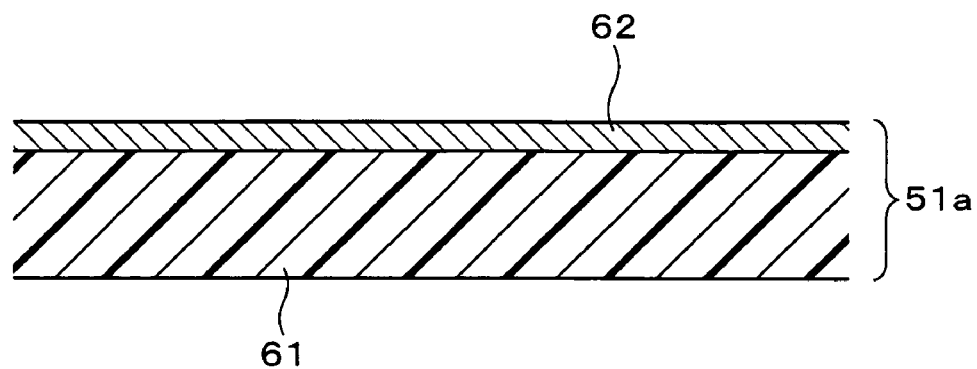
FIGS. 2(a) and 2(b) are partial cross-sectional views illustrating the optical recording medium master copy in the process of FIG. 1.
Figure 2:
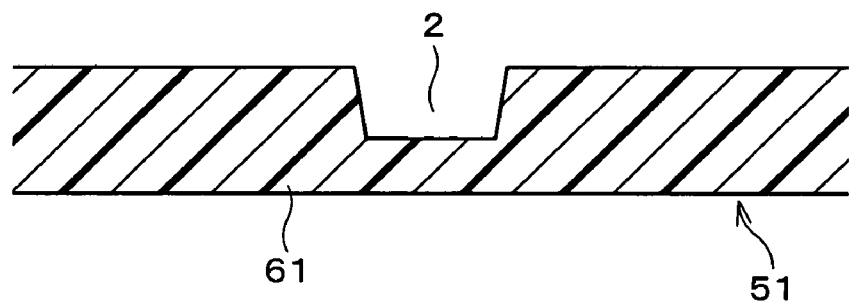

FIG. 1 is a flowchart explaining the methods of the present embodiment, i.e. the method of forming a micropattern and the method of manufacturing an optical recording medium master copy. FIG. 2(a) is a partial cross-sectional view illustrating an optical recording medium master copy 51a, which is in the course of manufacture and in such a state that a depressed part inducing layer 62 has been laminated on a resin substrate (resin layer) 61 as a result of the film-forming step of FIG. 1. FIG. 2(b) is a partial cross-sectional view illustrating the optical recording medium master copy 51a, in which pit parts and/or guiding grooves 2 (the pit parts and/or guiding grooves 2 are micropatterns (depressed part)) have been formed in the resin substrate 61 as a result of the film-peeling step of FIG. 1.

In FIG. 2(a), the resin substrate (resin layer) 61 and the depressed part inducing layer 62 are adjacent to each other.

However, another thin layer such as a layer of Al (thickness: 5 nm) may be provided between the resin substrate (resin layer) 61 and the depressed part inducing layer 62, although it is preferable for the purpose of forming the depressed part if the resin substrate (resin layer) 61 and the depressed part inducing layer 62 are adjacent to each other.

In the figures of Embodiments 2 through 5 (described later), (i) the resin substrate (resin layer) and the depressed part inducing layer are adjacent to each other, (ii) the depressed part inducing layer and the heat-absorbing layer are adjacent to each other, and (iii) the heat-absorbing layer and the metal layer are adjacent to each other. However, as in the case above, it is not necessary that these layers are adjacent to each other. Instead, another thin layer may be provided between the layers. For the purpose of forming the depressed part, however, it is preferable if (i) the resin substrate (resin layer) and the depressed part inducing layer are adjacent to each other, (ii) the depressed part inducing layer and the heat-absorbing layer are adjacent to each other, and (iii) the heat-absorbing layer and the metal layer are adjacent to each other.

Therefore, the claim language "laminating . . . and . . . ", and "laminating . . . , . . . , and . . . in this order" do not mean that the layers laminated are adjacent to each other. What is meant by the claim language is that another layer may be provided between the layers. For the purpose of forming the depressed part, however, it is preferable if the layers are adjacent to each other.

First, in the film-forming step S1, the depressed part inducing layer 62, which is made of dielectric material or metal oxide, is formed on the resin substrate (resin layer) 61. As a result, a lamination including the resin substrate 61 and the depressed part inducing layer 62 is formed. The lamination is the optical recording medium master copy 51a in the course of manufacture.

The resin substrate 61 needs to give appropriate strength to the depressed part inducing layer 62. If the recording beam (light beam) is radiated from the side of the depressed part inducing layer 62 in the subsequent recording step, the optical characteristic of the material of the resin substrate 61 is not particularly limited. Therefore, the material of the resin substrate 61 may be transparent or non-transparent. On the other hand, if the recording beam is radiated from the side of the resin substrate 61 in the recording step, it is preferable, from the viewpoint of light utilization efficiency, if the optical characteristic of the material of the resin substrate 61 is transparent at the wavelength of the recording beam, so as not to prevent the incidence of the recording beam.

The material of the resin substrate 61 is not particularly limited, but it is preferable if an organic compound is used. Examples of the organic compound are (i) thermoplastic transparent resin (plastic) such as polyolefin resin, polycarbonate, thermoplastic polyimide, PET (polyethylene terephthalate), PEN (polyethernitrile), and PES (polyethersulfone); (ii) thermosetting transparent resin such as thermosetting polyimide and ultraviolet-curable acrylic resin; and (iii) a combination of these compounds. Among these examples, polyolefin resin is particularly preferable.

The thickness of the resin substrate 61 is not particularly limited. For example, an appropriate thickness of the resin substrate 61 is on the order of 0.1 mm to 1.2 mm.

On the inner surface of the resin substrate 61 (the surface closer to the depressed part inducing layer 62), (i) pits corresponding to information to be recorded, and/or (ii) guiding grooves may be formed in advance.

As described above, the depressed part inducing layer 62 is made of dielectric material or metal oxide. More specifically, the depressed part inducing layer 62 is made of AlN, SiN, or the like dielectric material, or ZnO, $SnO_2$, or the like metal oxide. Among these examples, ZnO (zinc oxide) is particularly preferable. The thickness of the depressed part inducing layer 62 can be adjusted by changing the material thereof. An appropriate thickness of the depressed part inducing layer 62 is on the order of 5 nm to 800 nm, for example. However, a preferable thickness of the depressed part inducing layer 62 is 10 nm to 500 nm, if ZnO is chosen.

Next, in the recording step S2, the recording beam, which has been emitted from a light source and intensity-modulated by recording signals, is focused at least on the depressed part inducing layer 62 of the optical recording medium master copy 51a. The recording beam is focused through an object lens, while the optical recording medium master copy 51a is rotating. At this time, heat is generated in those parts of the depressed part inducing layer 62 irradiated by the recording beam. As a result, latent images respectively corresponding to the recording signals are formed on the resin substrate (resin layer) 61. The focused recording beam has a focal depth (generally represented by $\lambda/(NA \times NA)$; for example, the focal depth is about 1 μm if $\lambda$=408 nm, NA=0.65, and is about 300 nm if $\lambda$=257 nm, NA=0.9). Therefore, if a part of the depressed part inducing layer 62 is within the focal depth, the recording beam is focused on the depressed part inducing layer 62.

The recording beam may be radiated from the side of the resin substrate 61, or from the side of the depressed part inducing layer 62.

Next, in the film-peeling step S3, the depressed part inducing layer 62 of the optical recording medium master copy 51a is peeled off the resin substrate 61, thereby leaving the resin substrate 61 alone. The method of peeling is not particularly limited, as long as the depressed part inducing layer 62 can be peeled off selectively and completely. For example, it is possible to peel off the depressed part inducing layer 62 by soaking it in a solution to which the resin substrate 61 is insoluble but the depressed part inducing layer 62 is soluble. Examples of such a solution are NaOH or the like alkaline solution and $HNO_3$, $H_2SO_4$, or the like acid solution. When the depressed part inducing layer 62 is peeled off, the surface of the resin substrate 61 is exposed. As a result, the pit parts and/or guiding grooves 2 formed in the resin substrate 61 in the previous recording step are exposed.

In this way, the pit parts and/or guiding grooves (micropatterns) 2 are formed in the resin substrate 61. As a result, an optical recording medium master copy 51 is obtained.

In the present embodiment, the width and depth of the guiding grooves and the size (width) and depth of the prepits in the pit parts and/or guiding grooves 2 can be optimized by adjusting the rotation number of the optical recording medium master copy 51a and the power of the recording beam in the recording step S2. The size and depth of the prepits can be adjusted also by adjusting the duty of the recording signals.

Described below is an example of the methods of the present embodiment, i.e. the method of forming a micropattern and the method of manufacturing an optical recording medium master copy.

EXAMPLE 1

First, in the film-forming step S1, a ZnO film (depressed part inducing layer 62; thickness: on the order of 100 nm) is formed by magnetron sputtering on a polyolefin resin substrate (resin substrate 61; thickness: on the order of 0.5 mm). In this way, an optical recording medium master copy (lamination) 51a is formed.

In the recording step S2 of the present example, a laser recording device of low eccentricity accuracy is used. In view of the circumstance, recording is carried out while performing tracking servo. Therefore, the resin substrate 61 has a guiding groove part (track pitch: 0.8 μm; groove width: about 0.4 μm; groove depth: about 80 nm), and the guiding groove part is used in performing the tracking servo. In the present example, information is recorded in grooves (depressions in the guiding groove part).

Next, in the recording step S2, recording is carried out by focusing the recording beam (wavelength: 408 nm), which has been intensity-modulated by the recording signals, on the ZnO film (the depressed part inducing layer 62 of the lamination 51a). The recording beam is focused through an object lens (numerical aperture NA: 0.65), while the lamination 51a is rotating at a linear velocity of 1.8 m/s. The recording beam is radiated from the side of the depressed part inducing layer 62.

The diameter of the light beam spot of the focused recording beam is approximately 500 nm, according to the formula 0.8λ/NA. In order to record information, a rectangular wave having a frequency of 6.43 MHz (linear velocity: 1.8 m/s; pit pitch: 0.28 μm) is used as recording signals. The duty of the rectangular wave is 35%, and the beam power intensity of the recording beam is 0 mW when the rectangular wave is low, and 12.0 mW when the rectangular beam is high.

Next, in the film-peeling step S3, the optical recording medium master copy 51a is soaked in an $HNO_3$ solution (concentration: about 15%) for about one hour. In this way, the ZnO film (depressed part inducing layer 62) dissolves in the $HNO_3$ solution, and is peeled off the resin substrate 61. As a result, recording marks (pits) respectively corresponding to the recording signals are formed in the grooves. After that, the resin substrate 61 is cleaned with purified water, and baked at 95° C. for about one hour. Thus, an optical recording medium master copy 51 is formed.

Figure 3:
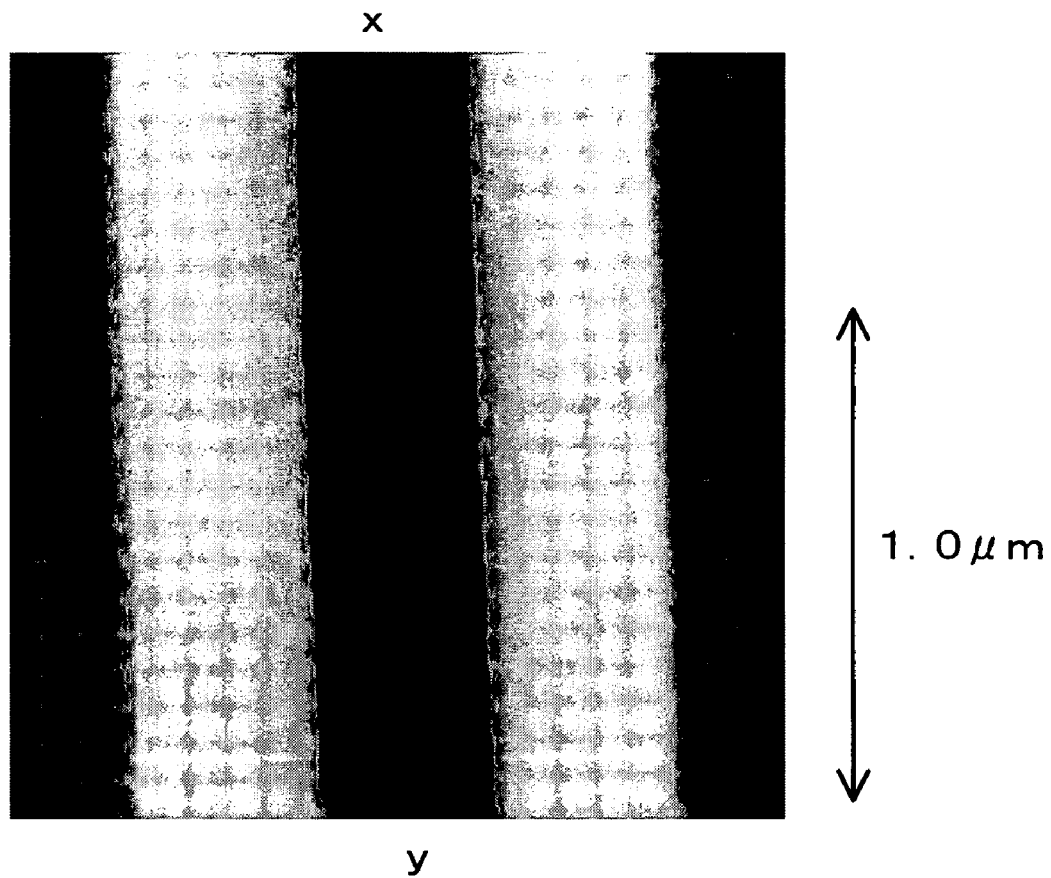
FIG. 3 is an image of the surface, on which prepits are formed, of an optical recording medium master copy of one example of the present invention.
Figure 4:
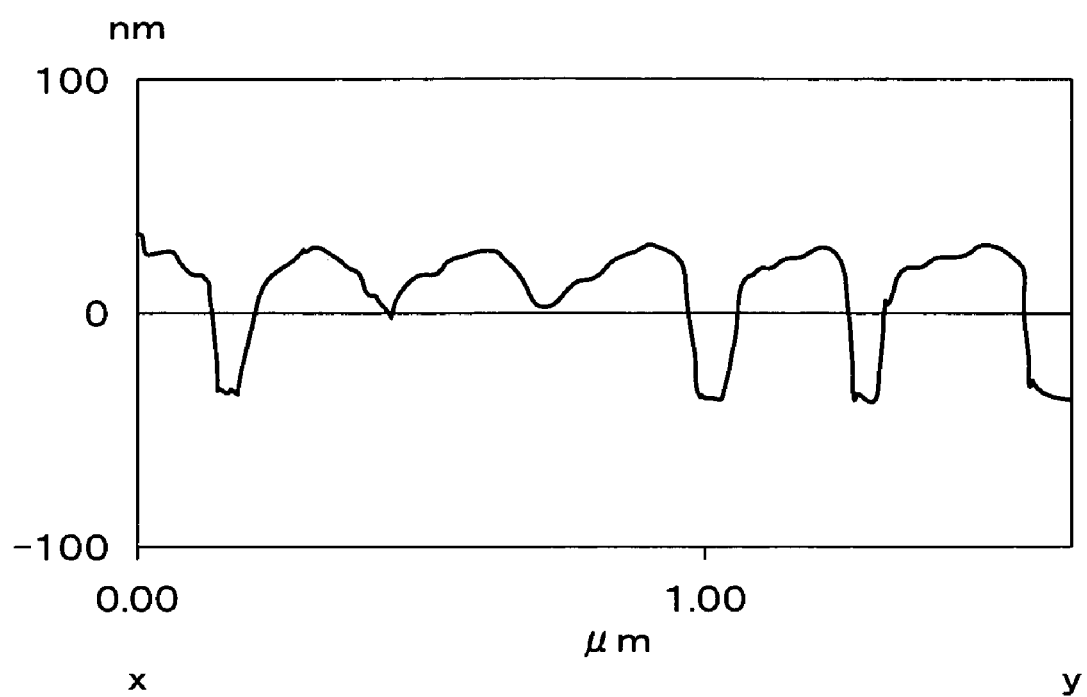
FIG. 4 is a cross-sectional view taken along the solid line x-y on the image of FIG. 3.

FIG. 3 is an AFM image (plan view) of such a part of the optical recording medium master copy 51 where the pits are formed. In the part shown in FIG. 3, the pits are formed at a pit pitch of 0.28 μm. In FIG. 3, the black circular marks are the pits, and the gray and black stripes are a groove and a land, which are formed in advance. FIG. 4 is a cross-sectional view taken along the solid line x-y on the plan view of FIG. 3.

In the present example, as described above, the pits are formed in the grooves. However, the pits may be formed on lands (protrusions in the guiding groove part) or planes (outside the guiding groove part). The recording pattern may have a groove-like shape.

As shown in FIGS. 3 and 4, the pits having a pit length of 140 nm or less and a pit depth of about 20 nm to 70 nm are formed, although the shapes of the pits are not uniform on the whole.

As described above, by using the methods of the present embodiment, i.e. the method of forming a micropattern and the method of manufacturing an optical recording medium master copy, it is possible to manufacture pit parts and/or guiding grooves (micropatterns) 2 having such track pitch and pit pitch that are smaller than the diameter of the light beam, and to manufacture an optical recording medium master copy 51 having the pit parts and/or guiding grooves 2.

The pit parts and/or guiding grooves 2 are smaller than the guiding grooves and prepits formed by the method disclosed in publication 1. Therefore, by using the methods of the present embodiment, i.e. the method of forming a micropattern and the method of manufacturing an optical recording medium master copy, it is possible to form guiding grooves and prepits having such track pitch and pit pitch that are smaller than before, and to manufacture an optical recording medium master copy having the guiding grooves and prepits.

Moreover, it is possible in this case to form small guiding grooves and prepits by a currently available and relatively inexpensive laser recording device using a light source of 240 nm to 700 nm, without requiring an expensive device such as the device used in carrying out the electron beam method disclosed in publication 2.

Figure 5:
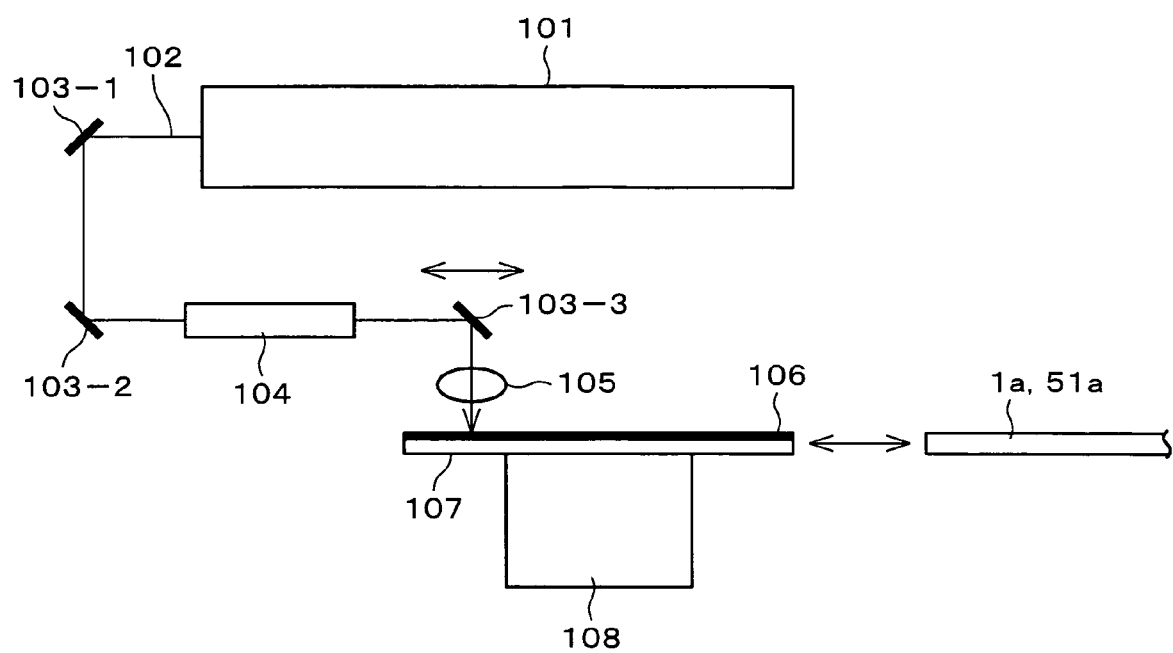
FIG. 5 is a schematic diagram illustrating an existing laser recording device that can be used in the foregoing embodiment.

FIG. 5 shows an example of an existing laser recording device that can be used in the recording step S2. In FIG. 5, referential numeral 101 is a laser light source using a light source of 240 nm to 700 nm. The laser light source 101 emits a recording beam 102, and the recording beam 102 is received by an optical modulator 104 after being reflected by two mirrors 103-1 and 103-2. The recording beam 102 is then subjected to intensity modulation in accordance with recording signals. After modulation, the recoding beam is reflected by a mirror 103-3. Then, the recording beam is focused on a glass substrate 107 through an object lens 105, while the glass substrate 107 is driven and rotated by a spindle motor 108. The irradiated surface of the glass substrate 107 is coated with positive photoresist 106.

In the recording step S2, the above-described laser recording device is used, and the recording beam 102 is focused on the optical recording medium master copy 51a, instead of the glass substrate 107 (which is coated with the positive photoresist 106), while the optical recording medium master copy 51a is driven and rotated by a spindle motor.

Figure 6:
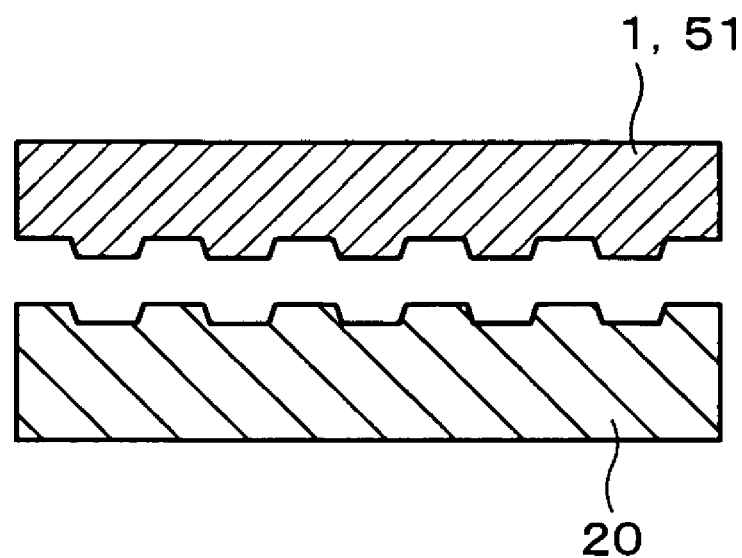
FIG. 6 is a diagram showing a process of manufacturing an optical recording medium stamper by using the optical recording medium master copy.
Figure 7:
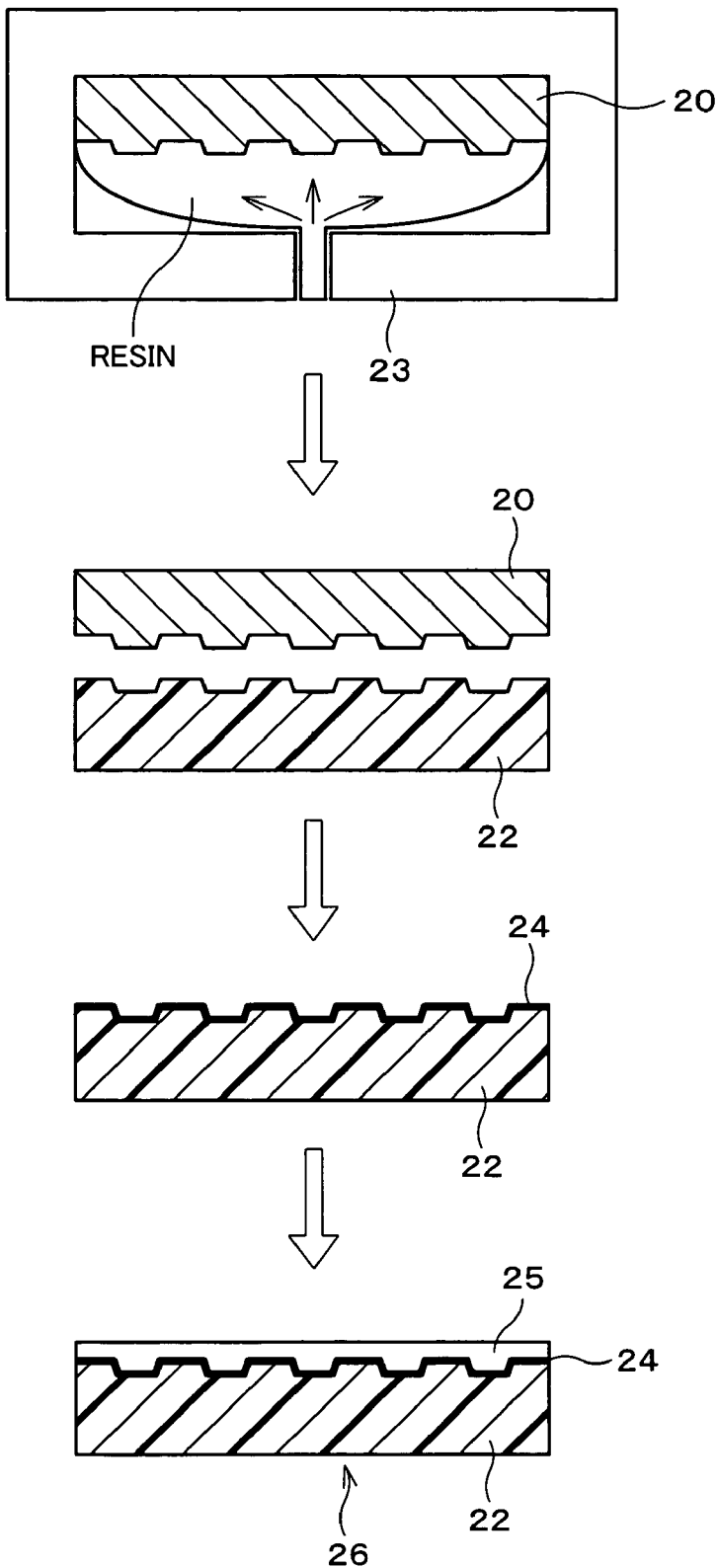
FIG. 7 is a diagram showing a process of manufacturing an optical recording medium by using the optical recording medium stamper.
Figure 8:
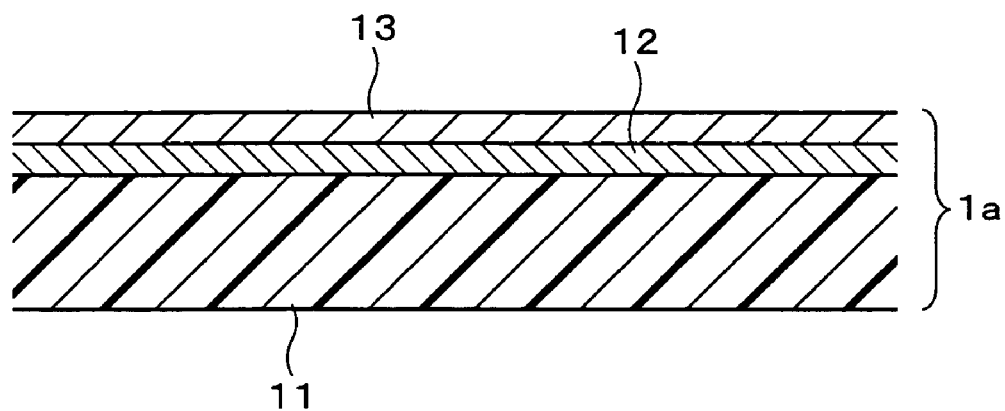
FIGS. 8(a) and 8(b) are partial cross-sectional views of an optical recording medium master copy in the manufacturing process, illustrating a method of forming a micropattern and a method of manufacturing an optical recording medium master copy that are of another embodiment of the present invention.
Figure 8:
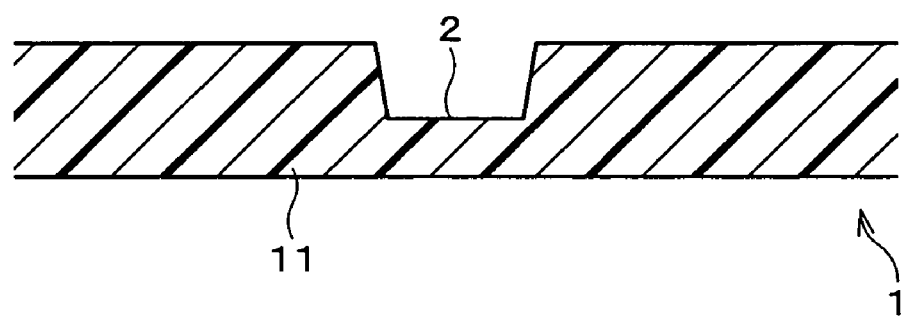

As shown in FIG. 6, if Ni electroforming is performed by using the optical recording medium master copy 51 manufactured as described above, an optical recording medium stamper 20 can be manufactured by so-called transfer. Furthermore, as shown in FIG. 7, by (1) using the optical recording medium stamper 20 to perform injection molding of a resin material such as polycarbonate, thereby obtaining an optical recording medium substrate 22, and (2) forming a thin-film section 24 (including a recording layer and the like) and, if necessary, a cover layer 25 and the like, on the optical recording medium substrate 22, it is possible to manufacture an optical recording medium 26 having such guiding grooves and prepits that have such track pitch and pit pitch that are smaller than before. In FIG. 7, referential numeral 23 is an optical recording medium mold.

Figure 26:
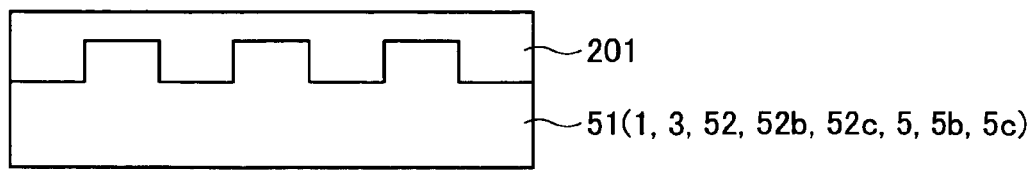
FIGS. 26(a) through 26(c) are partial cross-sectional views of an optical recording medium master copy in the manufacturing process, illustrating a method, according to one example of the present invention, of forming an optical recording medium substrate by employing a 2P method.
Figure 26:
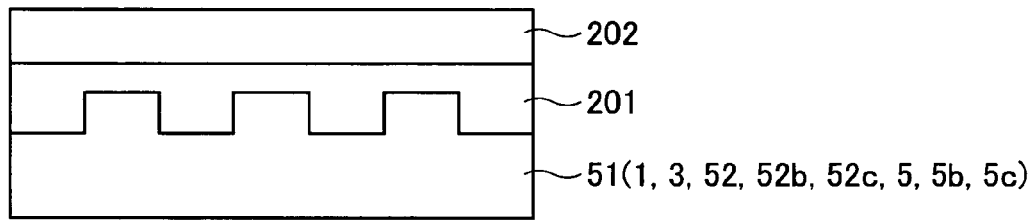
Figure 26:
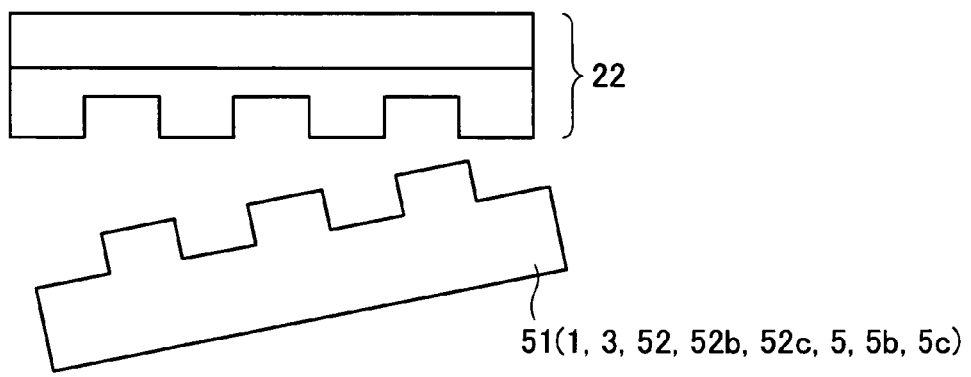

Moreover, by employing a 2P (Photo-Polymer) method, it is possible to manufacture an optical recording medium 26 having such guiding grooves and prepits that have such track pitch and pit pitch that are smaller than before, by (1) manufacturing the optical recording medium substrate 22 from the optical recording medium master copy 51, and (2) forming a thin-film section 24 (including a recording layer and the like) and, if necessary, a cover layer 25 and the like, on the optical recording medium substrate 22. The optical recording medium substrate 22 is manufactured by the 2P method as follows. First, as shown in FIG. 26(a), radiation curing resin 201 is applied onto the optical recording medium master copy 51. Then, as shown in FIG. 26(b), a substrate 202 is pressed against the radiation curing resin 201. In this way, the patterns on the optical recording medium master copy 51 are transferred to the radiation curing resin 201. After that, the radiation curing resin 201 is cured by radiation, so that the radiation curing resin 201 adheres to the substrate 202. Then, as shown in FIG. 26(c), the radiation curing resin 201 is separated from the optical recording medium master copy 51. As a result, the optical recording medium substrate 22 is obtained.

Embodiment 2

With reference to FIG. 1 and FIGS. 5 through 14, the following describes a method of forming a micropattern and a method of manufacturing an optical recording medium master copy that are another embodiment of the present invention. For the purpose of explanation, members whose functions are identical to those of the members in Embodiment 1 are labeled with identical referential numerals, and explanations of such members are omitted.

FIG. 1 is a flowchart explaining the methods of the present embodiment, i.e. the method of forming a micropattern and the method of manufacturing an optical recording medium master copy. FIG. 8(a) is a partial cross-sectional view illustrating an optical recording medium master copy 1a, which is in the course of manufacture and in such a state that an intermediate layer (depressed part inducing layer) 12 and a heat-absorbing layer 13 have been laminated in this order on a resin substrate (resin layer) 11 as a result of the film-forming step of FIG. 1. FIG. 8(b) is a partial cross-sectional view illustrating an optical recording medium master copy 1, in which pit parts and/or guiding grooves 2 (micropatterns; depressed part) have been formed in the resin substrate 11 as a result of the film-peeling step of FIG. 1.

First, in the film-forming step S1, the intermediate layer 12, which is made of dielectric material or metal oxide, is formed on the resin substrate (resin layer) 11. Then, the heat-absorbing layer 13 is formed on the intermediate layer 12. As a result, a lamination including (i) the resin substrate 11, (ii) the intermediate layer 12, and (iii) the heat-absorbing layer 13 is formed. The lamination is the optical recording medium master copy 1a in the course of manufacture.

Like the resin substrate 61 described above, the resin substrate 11 needs to give appropriate strength to the intermediate layer 12 and the heat-absorbing layer 13. If the recording beam is radiated from the side of the heat-absorbing layer 13 in the subsequent recording step, the optical characteristic of the material of the resin substrate 11 is not particularly limited. Therefore, the material of the resin substrate 11 may be transparent or non-transparent. On the other hand, if the recording beam is radiated from the side of the resin substrate 11 in the recording step, it is preferable, from the viewpoint of light utilization efficiency, if the optical characteristic of the material of the resin substrate 11 is transparent at the wavelength of the recording beam, so as not to prevent the incidence of the recording beam.

As in the case of the resin substrate 61, the material of the resin substrate 11 is not particularly limited, but it is preferable if an organic compound is used. Examples of the organic compound are (i) thermoplastic transparent resin (plastic) such as polyolefin resin, polycarbonate, thermoplastic polyimide, PET (polyethylene terephthalate), PEN (polyethernitrile), and PES (polyethersulfone); (ii) thermosetting transparent resin such as thermosetting polyimide and ultraviolet-curable acrylic resin; and (iii) a combination of these compounds. Among these examples, polyolefin resin is particularly preferable.

The thickness of the resin substrate 11 is not particularly limited. For example, an appropriate thickness of the resin substrate 11 is on the order of 0.1 mm to 1.2 mm.

On the inner surface of the resin substrate 11 (the surface closer to the intermediate layer 12), (i) pits corresponding to information to be recorded, and/or (ii) guiding grooves may be formed in advance.

If the recording beam is radiated from the side of the heat-absorbing layer 13 in the recording step, the optical characteristic of the material of the intermediate layer 12 is not particularly limited. Therefore, the material of the intermediate layer 12 may be transparent or non-transparent. On the other hand, if the recording beam is radiated from the side of the resin substrate 11 in the recording step, it is preferable as in the case of the resin substrate 11 from the viewpoint of light utilization efficiency, if the optical characteristic of the material of the intermediate layer 12 is transparent at the wavelength of the recording beam, so as not to prevent the incidence of the recording beam.

As described above, the intermediate layer 12 is made of dielectric material or metal oxide. More specifically, like the depressed part inducing layer 62 described above, the intermediate layer 12 is made of AlN, SiN, or the like dielectric material, or ZnO, $SnO_2$, or the like metal oxide. Among these examples, ZnO (zinc oxide) is particularly preferable. The thickness of the intermediate layer 12 can be adjusted by changing the material thereof. An appropriate thickness of the intermediate layer 12 is on the order of 5 nm to 800 nm, for example. However, a preferable thickness of the intermediate layer 12 is 10 nm to 500 nm, if ZnO is chosen.

It is preferable if the heat-absorbing layer 13 is made of such a material that absorbs the recording beam and converts it into heat. More specifically, examples of such a material are (i) Si film, (ii) Ge film, (iii) phase change film such as AgInSbTe film and GeSbTe film, (iv) magnetooptical film such as TbFeCo film, DyFeCo film, and GdFeCo film, and (v) alloy film of these materials. Among these examples, Si film is most preferable.

The thickness of the heat-absorbing layer 13 can be adjusted by changing the material thereof. An appropriate thickness of the heat-absorbing layer 13 is on the order of 3 nm to 300 nm, for example. However, a preferable thickness of the heat-absorbing layer 13 is 5 nm to 100 nm, if Si is chosen.

Next, in the recording step S2, the recording beam, which has been emitted from a light source and intensity-modulated by recording signals, is focused at least on the heat-absorbing layer 13 of the optical recording medium master copy 1a. The recording beam is focused through an object lens, while the optical recording medium master copy 1a is rotating. At this time, heat is generated in those parts of the heat-absorbing layer 13 irradiated by the recording beam. As a result, latent images respectively corresponding to the recording signals are formed on the resin substrate 11. The focused recording beam has a focal depth (generally represented by $\lambda/(NA \times NA)$; for example, the focal depth is about 1 μm if $\lambda=408$ nm, NA=0.65, and is about 300 nm if $\lambda=257$ nm, NA=0.9). Therefore, if a part of the heat-absorbing layer 13 is within the focal depth, the recording beam is focused on the heat-absorbing layer 13.

The recording beam may be radiated from the side of the resin substrate 11, or from the side of the heat-absorbing layer 13. However, for the following reason, it is preferable if the recording beam is radiated from the side of the resin substrate 11. If the recording beam is radiated from the side of the resin substrate 11, the heat generated in the heat-absorbing layer 13 is easily transmitted to the intermediate layer 12, and, because the recording beam is transmitted through the intermediate layer 12, the intermediate layer 12 generates heat by absorbing the recording beam. Therefore, radiating the recording beam from the side of the resin substrate 11 is more advantageous than radiating the recording beam from the side of the heat-absorbing layer 13 in the following respects: (1) the shapes of the pit parts and/or guiding grooves 2 are more uniform after the film-peeling step, and (2) recording can be carried out at lower power. Because the recording beam needs to be absorbed by the heat-absorbing layer 13, it is preferable if the wavelength of the light source is in such a range that the heat-absorbing layer 13 absorbs heat.

Next, in the film-peeling step S3, the intermediate layer 12 and the heat-absorbing layer 13 of the optical recording medium master copy 1a are peeled off the resin substrate 11, thereby leaving the resin substrate 11 alone. The method of peeling is not particularly limited, as long as the intermediate layer 12 and the heat-absorbing layer 13 can be peeled off selectively and completely. For example, it is possible to peel off the intermediate layer 12 and the heat-absorbing layer 13 by soaking them in a solution to which the resin substrate 11 is insoluble but the intermediate layer 12 and the heat-absorbing layer 13 are soluble. Examples of such a solution are NaOH or the like alkaline solution and $HNO_3$, $H_2SO_4$, or the like acid solution. It is not necessary to peel off both the intermediate layer 12 and the heat-absorbing layer 13. If the intermediate layer 12 (which is adjacent to the resin substrate 11) is peeled off the resin substrate 11, the heat-absorbing layer 13 (which is provided on the intermediate layer 12) is simultaneously peeled off. Therefore, it is sufficient if the intermediate layer 12 is peeled off. When the intermediate layer 12 and the heat-absorbing layer 13 are peeled off, the surface of the resin substrate 11 is exposed. As a result, the pit parts and/or guiding grooves 2 formed in the resin substrate 11 in the previous recording step are exposed.

In this way, the pit parts and/or guiding grooves (micropatterns) 2 are formed in the resin substrate 11. As a result, an optical recording medium master copy 1 is obtained.

In the case of Embodiment 1, heat is not generated efficiently in the recording step S2 in those parts of the depressed part inducing layer 62 irradiated by the recording beam. As a result, the pit parts and/or guiding grooves 2 have irregular shapes.

On the other hand, in the present embodiment, the heat-absorbing layer 13 is formed on the intermediate layer (depressed part inducing layer) 12 in the film-forming step S1. Due to the presence of the heat-absorbing layer 13, heat is generated more efficiently upon radiation of the recording beam. Therefore, a larger amount of heat is transmitted to the intermediate layer 12. In this case, the shapes of the pit parts and/or guiding grooves 2 are more uniform. As a result, it is possible to reduce the jitter of reproduced signals, thereby reducing the error rate of the reproduced signals.

In the present embodiment, the width and depth of the guiding grooves and the size (width) and depth of the prepits in the pit parts and/or guiding grooves 2 can be optimized by adjusting the rotation number of the optical recording medium master copy 1a and the power of the recording beam in the recording step S2. The size and depth of the prepits can be adjusted also by adjusting the duty of the recording signals.

Described below are two examples of the methods of the present embodiment, i.e. the method of forming a micropattern and the method of manufacturing an optical recording medium master copy.

EXAMPLE 2

First, in the film-forming step S1, a ZnO film (intermediate layer 12; thickness: on the order of 100 nm), and an Si film (heat-absorbing layer 13; thickness: on the order of 30 nm) are formed by magnetron sputtering on a polyolefin resin substrate (resin substrate 11; thickness: on the order of 0.5 mm). In this way, an optical recording medium master copy (lamination) 1a is formed.

In the recording step S2 of the present example, a laser recording device of low eccentricity accuracy is used. In view of the circumstance, recording is carried out while performing tracking servo. Therefore, the resin substrate 11 has a guiding groove part (track pitch: 0.8 μm; groove width: about 0.4 μm; groove depth: about 80 nm), and the guiding groove part is used in performing the tracking servo. In the present example, information is recorded on lands (protrusions in the guiding groove part).

Next, in the recording step S2, recording is carried out by focusing the recording beam (wavelength: 408 nm), which has been intensity-modulated by the recording signals, on the Si film (the heat-absorbing layer 13 of the lamination). The recording beam is focused through an object lens (numerical aperture NA: 0.65), while the lamination is rotating at a linear velocity of 1.8 m/s. The recording beam is radiated from the side of the heat-absorbing layer 13.

The diameter of the light beam spot of the focused recording beam is approximately 500 nm, according to the formula $0.8\lambda/NA$. In order to record information, two kinds of rectangular waves are used as recording signals. One has a frequency of 2.25 MHz (linear velocity: 1.8 m/s; pit pitch: 0.8 μm), and the other has a frequency of 9.00 MHz (linear velocity: 1.8 m/s; pit pitch: 0.2 μm). The duty of the rectangular waves is 35%. The beam power intensity of the recording beam is 0 mW when the rectangular waves are low, 11.5 mW (at the frequency of 2.25 MHz) or 12.0 mW (at the frequency of 9.00 MHz) when the rectangular waves are high.

Next, in the film-peeling step S3, the optical recording medium master copy 1a is soaked in an $HNO_3$ solution (concentration: about 15%) for about one hour. In this way, the ZnO film (intermediate layer 12) and the Si film (heat-absorbing layer 13) dissolve in the $HNO_3$ solution, and are peeled off the resin substrate 11. As a result, recording marks (pits) respectively corresponding to the recording signals are formed on the lands. After that, the resin substrate 11 is cleaned with purified water, and baked at 95° C. for about one hour. Thus, an optical recording medium master copy 1 is formed.

Figure 9:
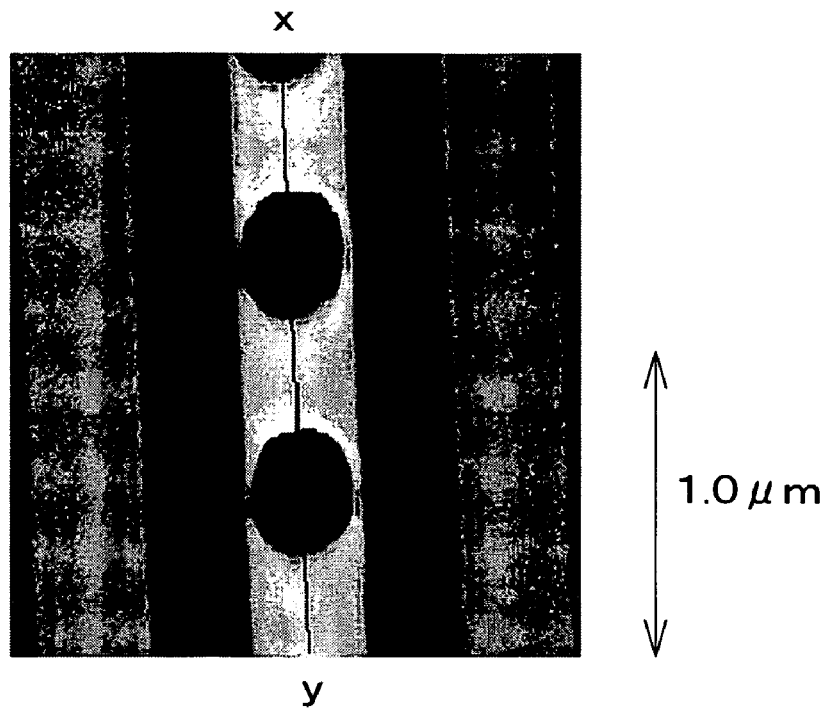
FIG. 9 is an image of the surface, on which prepits are formed, of an optical recording medium master copy of another example of the present invention.
Figure 10:
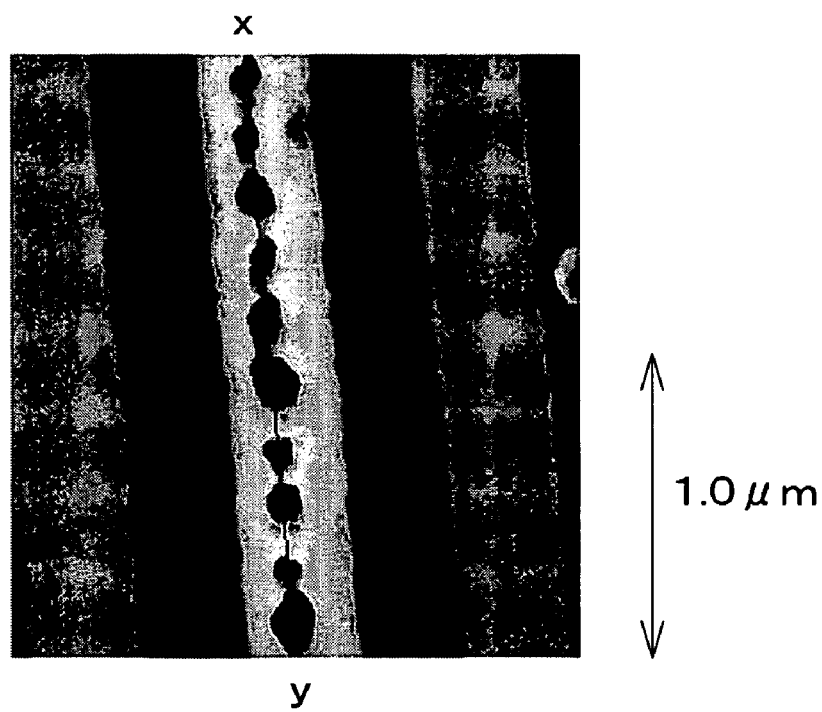
FIG. 10 is an image of the surface, on which prepits are formed, of the optical recording medium master copy of another example of the present invention.
Figure 11:
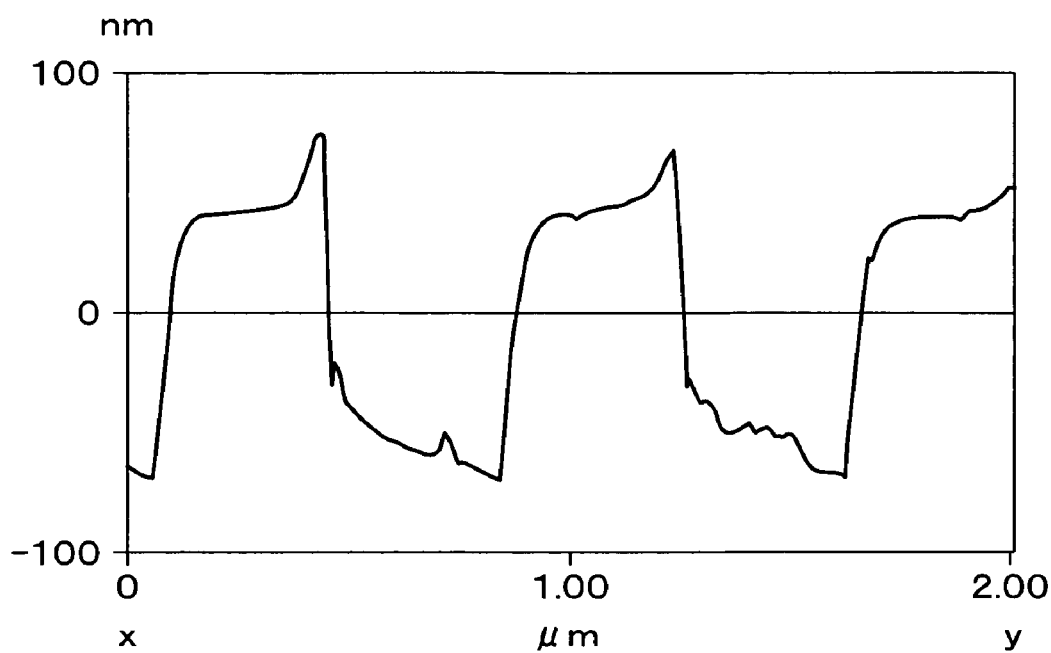
FIG. 11 is a cross-sectional view taken along the solid line x-y on the image of FIG. 9.
Figure 12:
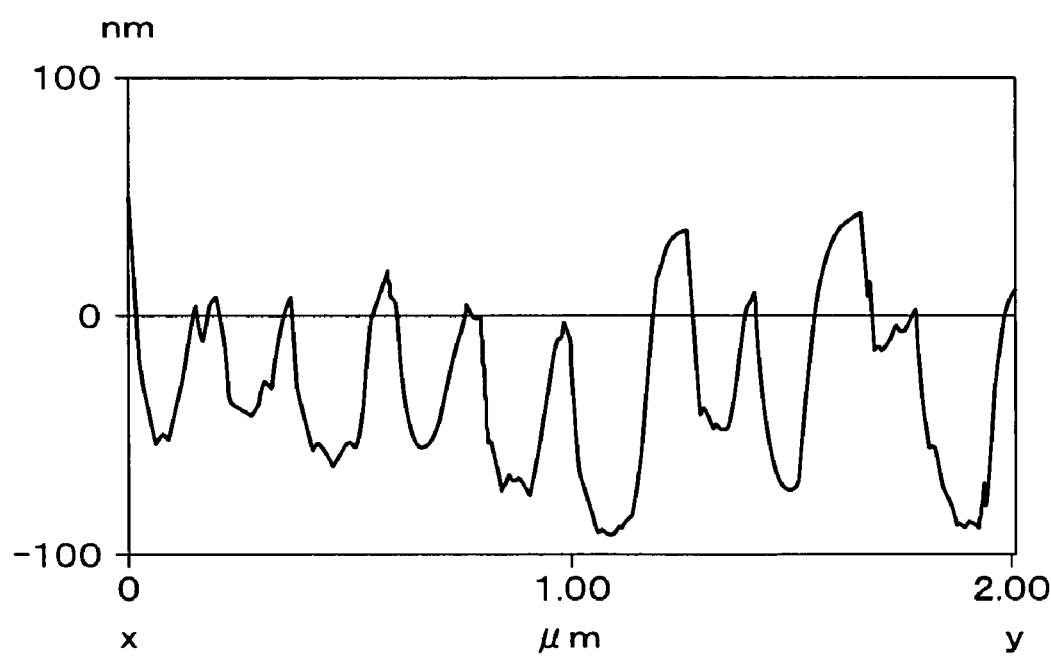
FIG. 12 is a cross-sectional view taken along the solid line x-y on the image of FIG. 10.

Thus, the pits are formed on the optical recording medium master copy 1 at two different pit pitches. FIG. 9 is an AFM image (plan view) of such a part where the pits are formed at a pit pitch of 0.8 μm. FIG. 10 is an AFM image (plan view) of such a part where the pits are formed at a pit pitch of 0.2 μm. In FIGS. 9 and 10, black circular marks are the pits, and the black and gray stripes are a groove and a land, which are formed in advance. FIG. 11 is a cross-sectional view taken along the solid line x-y on the plan view of FIG. 9. FIG. 12 is a cross-sectional view taken along the solid line x-y on the plan view of FIG. 10.

In the present example, as described above, the pits are formed on the lands. However, the pits may be formed on grooves (depressions in the guiding groove part) or planes (outside the guiding groove part). The record pattern may have a groove-like shape.

As shown in FIGS. 9 and 11, at the pit pitch of 0.8 μm, the pits having a pit length of about 400 nm and a pit depth of about 100 nm are formed almost uniformly. In the part where the pit pitch is 0.2 μm, the pits having a pit length of 200 nm or less and a pit depth of about 30 nm to 150 nm are formed, although the shapes of the pits are not uniform on the whole.

EXAMPLE 3

In Example 2, the recording beam is radiated from the side of the heat-absorbing layer 13. On the other hand, in the present example, the recording beam is radiated from the side of the resin substrate 11. When the rectangular wave is high, the beam power intensity of the recording beam is 6.5 mW (at the frequency of 2.25 MHz) or 6.0 mW (at the frequency of 9.00 MHz). The present example is the same as Example 2 except the incidence direction of the recording beam and the laser power intensity in the recording step S2.

Figure 13:
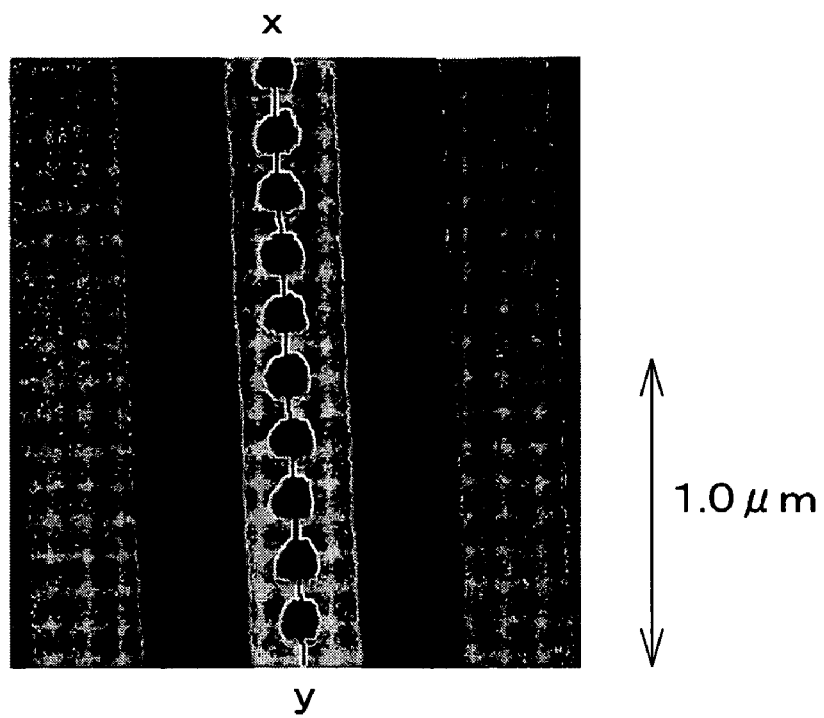
FIG. 13 is an image of the surface, on which prepits are formed, of an optical recording medium master copy of yet another example of the present invention.
Figure 14:
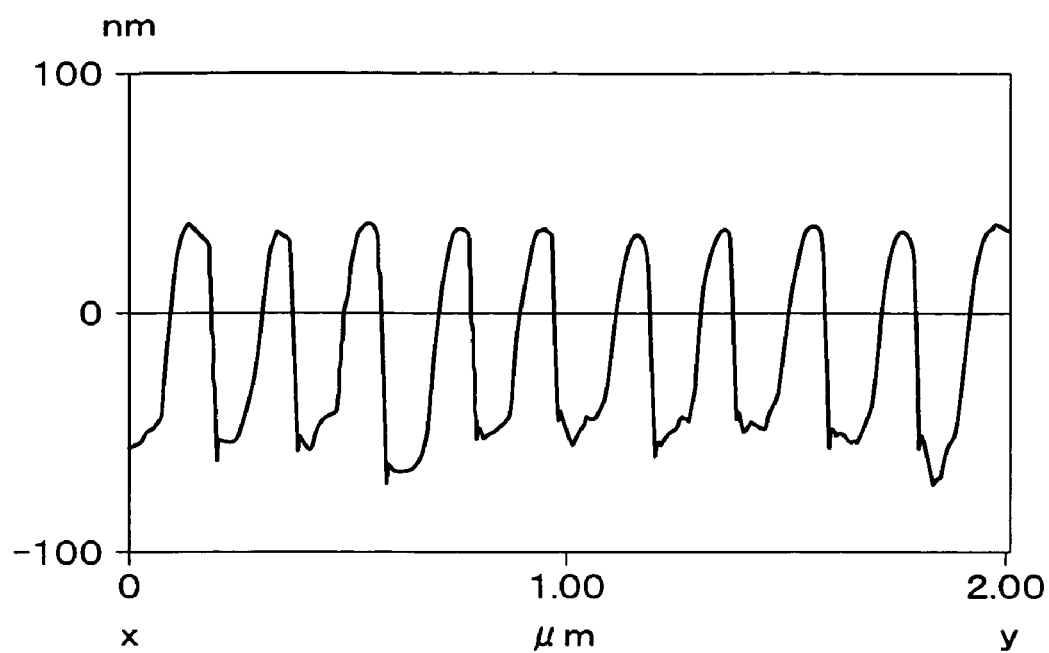
FIG. 14 is a cross-sectional view taken along the solid line x-y on the image of FIG. 13.

Thus, two kinds of pits are formed on the optical recording medium master copy 1. FIG. 13 is an AFM image (plan view) of such a part where the pits are formed at a pit pitch of 0.2 μm. In the part where the pits are formed at the pit pitch of 0.2 μm, the shapes of the pits are more uniform than the pits of Example 2. In FIG. 13, the black circular marks are the pits, and the black and gray stripes are a groove and a land, which are formed in advance. FIG. 14 is a cross-sectional view taken along the solid line x-y on the plan view of FIG. 13.

In the present example, the pits are formed on the lands. However, the pits may be formed on grooves (depressions in the guiding groove part) or planes (outside the guiding groove part). The record pattern may have a groove-like shape.

In Example 2, neither the pit length nor the pit depth is uniform at the pit pitch of 0.2 μm. On the other hand, in the present example, almost uniform pits (pit length: about 110 nm; pit depth: about 90 nm) are formed at lower power. The difference is clear by comparing FIG. 10 with FIG. 13, and FIG. 12 with FIG. 14.

Thus, the pits formed in the present example are more uniform than the pits in Example 2. The reason for this phenomenon is presumably as follows. In Example 2, the recording beam is radiated from the side of the heat-absorbing layer 13. Therefore, the thicker the heat-absorbing layer 13 is, the more difficult it is to transmit the heat generated in the heat-absorbing layer 13 to the intermediate layer 12. In addition, the thicker the heat-absorbing layer 13 is, the more uneven the transmitted heat is. On the other hand, in the present example, the recording beam is radiated from the side of the resin substrate 11. Therefore, the heat generated in the heat-absorbing layer 13 is more easily transmitted to the intermediate layer 12, and the transmitted heat is less uneven. Thus, the pits formed in the present example are more uniform. As a result, the jitter of reproduced signals is reduced, and the error rate of the reproduced signals is smaller than that of Example 1.

In the present example, the pits are formed at lower power than in Example 2. The reason for this phenomenon is presumably as follows. In Example 2, the recording beam is radiated from the side of the heat-absorbing layer 13. Therefore, the heat generated in the heat-absorbing layer 13 is not easily transmitted to the intermediate layer 12. On the other hand, in the present example, the heat generated in the heat-absorbing layer 13 is easily transmitted to the intermediate layer 12, because the recording beam is transmitted from the side of the resin substrate 11. Moreover, because the recording beam is transmitted from the side of the resin substrate 11 in the present example, the recording beam is transmitted through the intermediate layer 12. Therefore, the intermediate layer 12 absorbs and generates heat by itself. As a result, in the present example, heat that is equivalent to the heat in Example 2 can be applied to the intermediate layer 12 at lower power. Therefore, the pits are formed at lower power.

As described above, by using the methods of the present embodiment, i.e. the method of forming a micropattern and the method of manufacturing an optical recording medium master copy, it is possible to manufacture pit parts and/or guiding grooves (micropatterns) 2 having such track pitch and pit pitch that are smaller than the diameter of the light beam, and to manufacture an optical recording medium master copy 1 having the pit parts and/or guiding grooves 2.

The pit parts and/or guiding grooves 2 formed in the foregoing manner are smaller than the guiding grooves and prepits formed by the method disclosed in publication 1. Therefore, by using the methods of the present embodiment, i.e. the method of forming a micropattern and the method of manufacturing an optical recording medium master copy, it is possible to form guiding grooves and prepits having such track pitch and pit pitch that are smaller than before, and to manufacture an optical recording medium master copy having the guiding grooves and prepits.

Moreover, it is possible in this case to form small guiding grooves and prepits by a currently available and relatively inexpensive laser recording device (see, for example, FIG. 5) using a light source of 240 nm to 700 nm or a light source of 350 nm to 450 nm, without requiring an expensive device such as the device used in carrying out the electron beam method disclosed in publication 2.

By using the methods of the present embodiment, i.e. the method of forming a micropattern and the method of manufacturing an optical recording medium master copy, it is possible to form the pit parts and/or guiding grooves 2 in more uniform shapes than in Example 1. Therefore, it is possible to reduce the jitter of reproduced signals, thereby reducing the error rate of the reproduced signals.

As shown in FIG. 6, if Ni electroforming is performed by using the optical recording medium master copy 1 manufactured as described above, an optical recording medium stamper 20 can be manufactured by so-called transfer. Furthermore, as shown in FIG. 7, by (1) using the optical recording medium stamper 20 to perform injection molding of a resin material such as polycarbonate, thereby obtaining an optical recording medium substrate 22, and (2) forming a thin-film section 24 (including a recording layer and the like) and, if necessary, a cover layer 25 and the like, on the optical recording medium substrate 22, it is possible to manufacture an optical recording medium 26 having such guiding grooves and prepits whose track pitch and pit pitch are smaller than before. In FIG. 7, referential numeral 23 is an optical recording medium mold.

Moreover, by employing a 2P (Photo-Polymer) method, it is possible to manufacture an optical recording medium 26 having such guiding grooves and prepits that have such track pitch and pit pitch that are smaller than before, by (1) manufacturing the optical recording medium substrate 22 from the optical recording medium master copy 1, and (2) forming a thin-film section 24 (including a recording layer and the like) and, if necessary, a cover layer 25 and the like, on the optical recording medium substrate 22. The optical recording medium substrate 22 is manufactured by the 2P method as follows. First, as shown in FIG. 26(a), radiation curing resin 201 is applied onto the optical recording medium master copy 1. Then, as shown in FIG. 26(b), a substrate 202 is pressed against the radiation curing resin 201. In this way, the patterns on the optical recording medium master copy 1 are transferred to the radiation curing resin 201. After that, the radiation curing resin 201 is cured by radiation, so that the radiation curing resin 201 adheres to the substrate 202. Then, as shown in FIG. 26(c), the radiation curing resin 201 is separated from the optical recording medium master copy 1. As a result, the optical recording medium substrate 22 is obtained.

Embodiment 3

With reference to FIG. 1 and FIGS. 15 through 17, the following describes a method of forming a micropattern and a method of manufacturing an optical recording medium master copy that are yet another embodiment of the present invention. For the purpose of explanation, members whose functions are identical to those of the members in Embodiment 1 are labeled with identical referential numerals, and explanations of such members are omitted.

Figure 15:
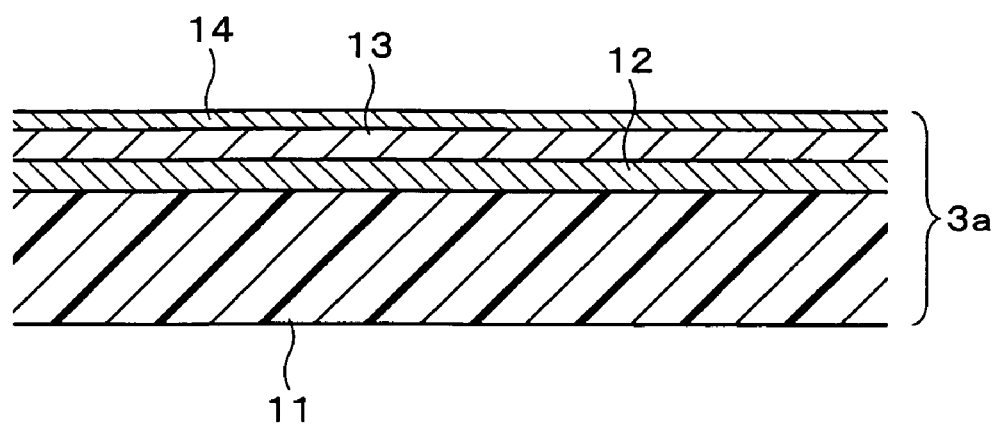
FIGS. 15(a) and 15(b) are partial cross-sectional views of an optical recording medium master copy in the manufacturing process, illustrating a method of forming a micropattern and a method of manufacturing an optical recording medium master copy that are of yet another embodiment of the present invention.
Figure 15:
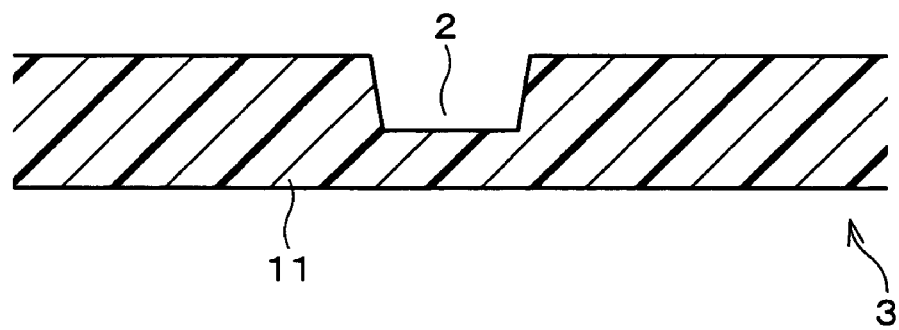

FIG. 1 is a flowchart explaining the methods of the present embodiment, i.e. the method of forming a micropattern and the method of manufacturing an optical recording medium master copy. FIG. 15(*a*) is a partial cross-sectional view illustrating an optical recording medium master copy 3*a*, which is in the course of manufacture and in such a state that an intermediate layer (depressed part inducing layer) 12, a heat-absorbing layer 13, and a metal layer 14 have been laminated in this order on a resin substrate (resin layer) 11 as a result of the film-forming step of FIG. 1. FIG. 15(*b*) is a partial cross-sectional view illustrating an optical recording medium master copy 3, in which pit parts and/or guiding grooves 2 have been formed in the resin substrate 11 as a result of the film-peeling step of FIG. 1.

First, in the film-forming step S1, the intermediate layer 12 is formed on the resin substrate 11, and the heat-absorbing layer 13 is formed on the intermediate layer 12. In addition, in the present embodiment, the metal layer 14 is formed on the heat-absorbing layer 13. As a result, an optical recording medium master copy 3*a* is obtained.

The material of the metal layer 14 is not particularly limited, as long as the material is metal. However, it is preferable if the metal layer 14 is a high-reflectance metal film. Specifically, examples of the high-reflectance metal film are Al film, Au film, Ag film, and alloy film of these materials. The thickness of the metal layer 14 may be adjusted to a desired thickness, with no particular limitation. For example, the thickness of the metal layer 14 is on the order of 10 nm to 100 nm.

Next, in the recording step S2, the recording beam, which has been emitted from a light source and intensity-modulated by recording signals, is focused at least on the heat-absorbing layer 13 of the optical recording medium master copy 3*a*. The recording beam is focused through an object lens, while the optical recording medium master copy 3*a* is rotating. Unlike Embodiments 1 and 2, the recording beam needs to be radiated from the side of the resin substrate 11. If the recording beam is radiated from the side of the metal layer 14, the metal layer 14 reflects the recording beam, thereby preventing it from reaching the heat-absorbing layer 13. As a result, no heat is generated. The focused recording beam has a focal depth (generally represented by $\lambda/(NA \times NA)$; for example, the focal depth is about 1 μm if $\lambda$=408 nm, NA=0.65, and is about 300 nm if $\lambda$=257 nm, NA=0.9). Therefore, if a part of the heat-absorbing layer 13 is within the focal depth, the recording beam is focused on the heat-absorbing layer 13.

Next, in the film-peeling step S3, the intermediate layer 12, the heat-absorbing layer 13, and the metal layer 14 of the optical recording medium master copy 3*a* are peeled off the resin substrate 11. The method of peeling is not particularly limited, as long as the intermediate layer 12, the heat-absorbing layer 13, and the metal layer 14 can be peeled off completely. For example, it is possible to peel off the intermediate layer 12, the heat-absorbing layer 13, and the metal layer 14 by soaking them in a solution to which the resin substrate 11 is insoluble but the intermediate layer 12, the heat-absorbing layer 13, and the metal layer 14 are soluble. Examples of such a solution are NaOH or the like alkaline solution and $HNO_3$, $H_2SO_4$, or the like acid solution. It is not necessary to peel off all of the intermediate layer 12, the heat-absorbing layer 13, and the metal layer 14. If the intermediate layer 12 (which is adjacent to the resin substrate 11) is peeled off the resin substrate 11, the heat-absorbing layer 13 and the metal layer 14 (that are provided on the intermediate layer 12) are simultaneously peeled off. Therefore, it is sufficient if the intermediate layer 12 is peeled off. When the intermediate layer 12, the heat-absorbing layer 13, and the metal layer 14 are peeled off, the surface of the resin substrate 11 is exposed. As a result, the pit parts and/or guiding grooves 2 formed in the resin substrate 11 in the previous recording step are exposed.

In this way, the pit parts and/or guiding grooves (micropatterns) 2 are formed in the resin substrate 11. As a result, an optical recording medium master copy 3 is obtained.

In Example 2, there are cases where those parts of the heat-absorbing layer 13 irradiated by the recording beam explode. This deteriorates the uniformity of the shapes of the pit parts and/or guiding grooves 2.

On the other hand, in the present embodiment, the metal layer 14 is formed on the heat-absorbing layer 13 in the film-forming step S1. The metal layer 14 blocks the explosive force of the heat-absorbing layer 13, thereby preventing explosion. Therefore, the pit parts and/or guiding grooves 2 are formed in more uniform shapes. Therefore, it is possible to reduce the jitter of reproduced signals, thereby reducing the error rate of the reproduced signals.

In the present embodiment, the width and depth of the guiding grooves and the size (width) and depth of the prepits in the pit parts and/or guiding grooves 2 can be optimized by adjusting the rotation number of the optical recording medium master copy 3*a* and the power of the recording beam in the recording step S2. The size and depth of the prepits can be adjusted also by adjusting the duty of the recording signals.

Described below is an example of the methods of the present embodiment, i.e. the method of forming a micropattern and the method of manufacturing an optical recording medium master copy.

EXAMPLE 4

First, in the film-forming step S1, a ZnO film (depressed part inducing layer; intermediate layer 12; thickness: on the order of 100 nm), an Si film (heat-absorbing layer 13; thickness: on the order of 30 nm), and an Al film (metal layer 14; thickness: on the order of 20 nm) are formed in this order on a polyolefin resin substrate (resin substrate 11; thickness: on the order of 0.5 mm) by magnetron sputtering.

In the recording step S2 of the present example, a laser recording device of low eccentricity accuracy is used. In view of the circumstance, recording is carried out while performing tracking servo. Therefore, the resin substrate 11 has a guiding groove part (track pitch: 0.8 μm; groove width: about 0.41 μm; groove depth: about 80 nm), and the guiding groove part is used in performing the tracking servo. In the present example, information is recorded on lands (protrusions in the guiding groove part).

Next, in the recording step S2, recording is carried out by focusing the recording beam (wavelength: 408 nm), which has been intensity-modulated by the recording signals, on the Si film (heat-absorbing layer 13) and/or the Al film (metal layer 14) of the optical recording medium master copy 3*a*. The recording beam is focused through an object lens (numerical aperture NA: 0.65), while the optical recording medium master copy 3a is rotating at a linear velocity of 1.8 m/s. The recording beam is radiated from the side of the resin substrate 11.

The diameter of the light beam spot of the focused recording beam is approximately 500 nm, according to the formula $0.8\lambda/NA$. In the recording, two kinds of rectangular waves are used as recording signals. One has a frequency of 2.25 MHz (linear velocity: 1.8 m/s; pit pitch: 0.8 µm), and the other has a frequency of 9.00 MHz (linear velocity: 1.8 m/s; pit pitch: 0.2 µm). The duty of the rectangular waves is 35%. The beam power intensity of the recording beam is 0 mW when the rectangular waves are low, 8.8 mW (at the frequency of 2.25 MHz) or 10.2 mW (at the frequency of 9.00 MHz) when the rectangular waves are high.

Next, in the film-peeling step S3, the optical recording medium master copy 3a (recorded) is soaked in an $HNO_3$ solution (concentration: about 15%) for about one hour. In this way, the ZnO film (intermediate layer 12), the Si film (heat-absorbing layer 13), and the Al film (metal layer 14) dissolve in the $HNO_3$ solution, and are peeled off the resin substrate 11. As a result, recording marks (pits) respectively corresponding to the recording signals are formed on the lands. After that, the resin substrate 11 is cleaned with purified water, and baked at 95° C. for about one hour. Thus, an optical recording medium master copy 3 is formed.

Figure 16:
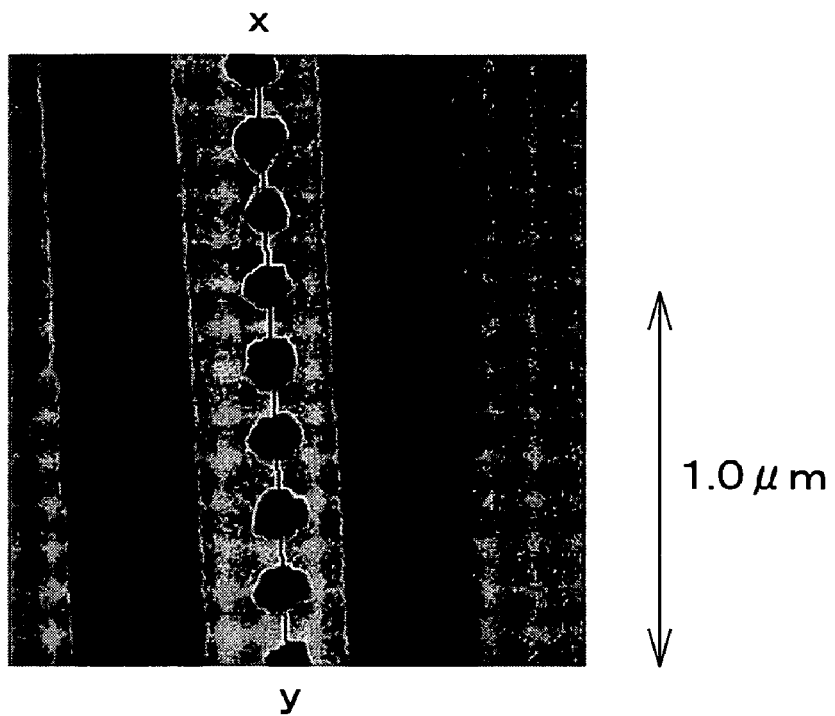
FIG. 16 is an image of the surface, on which prepits are formed, of an optical recording medium master copy of still another example of the present invention.
Figure 17:
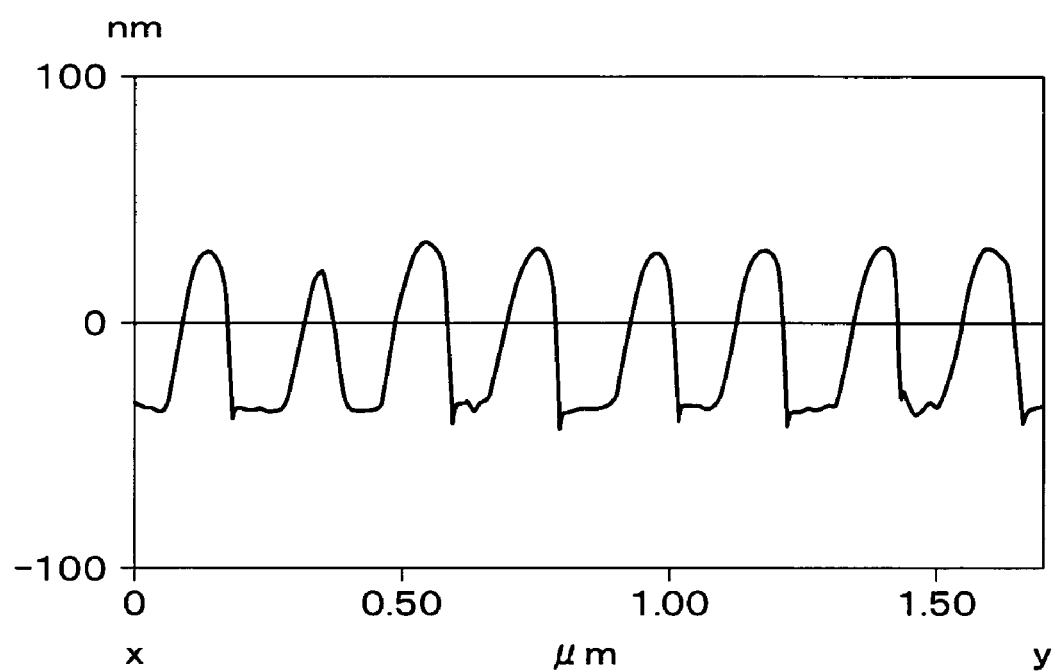
FIG. 17 is a cross-sectional view taken along the solid line x-y on the image of FIG. 16.

Thus, two kinds of pits are formed on the optical recording medium master copy 3. FIG. 16 is an AFM image (plan view) of such a part where the pits are formed at a pit pitch of 0.2 µm, as in Example 3. In FIG. 16, the black circular marks are the pits, and the black and gray stripes are a groove and a land, which are formed in advance. FIG. 17 is a cross-sectional view taken along the solid line x-y on the plan view of FIG. 16.

In the present embodiment, the pits are formed on the lands. However, the pits may be formed on grooves (depressions in the guiding groove part) or planes (outside the guiding groove part). The record pattern may have a groove-like shape.

As shown in FIGS. 16 and 17, at the pit pitch of 0.2 µm, the pits having a pit length of about 110 nm and a pit depth of about 60 nm are formed more uniformly. In the recording step S2, the Al film (metal layer 14) prevents the explosion of the Si film (heat-absorbing layer 13) by constraining the Si film. As a result, the shapes of the pits are more uniform than those in Example 3.

As described above, by using the methods of the present embodiment, i.e. the method of forming a micropattern and the method of manufacturing an optical recording medium master copy, it is possible, as in Embodiments 1 and 2, to form guiding grooves and prepits having such track pitch and pit pitch that are smaller than before, and to manufacture an optical recording medium master copy having the guiding grooves and prepits.

Moreover, as in Embodiments 1 and 2, it is possible to form small guiding grooves and prepits by a currently available and relatively inexpensive laser recording device (see, for example, FIG. 5) using a light source of 240 nm to 700 nm or a light source of 350 nm to 450 nm, without requiring an expensive device such as the device used in carrying out the electron beam method disclosed in publication 2.

By using the methods of the present embodiment, i.e. the method of forming a micropattern and the method of manufacturing an optical recording medium master copy, it is possible to form the pit parts and/or guiding grooves 2 in more uniform shapes than in Examples 1 and 2. Therefore, it is possible to reduce the jitter of reproduced signals, thereby reducing the error rate of the reproduced signals.

As in Embodiments 1 and 2, if Ni electroforming is performed by using the optical recording medium master copy 3 manufactured as described above, an optical recording medium stamper can be manufactured by so-called transfer. Furthermore, by (1) using the optical recording medium stamper to produce an optical recording medium substrate, and (2) forming a thin-film section (including a recording layer and the like) on the optical recording medium substrate, it is possible to manufacture an optical recording medium that has such guiding grooves and prepits whose track pitch and pit pitch are smaller than before, and that attains a smaller error rate of reproduced signals.

Moreover, by employing a 2P (Photo-Polymer) method, it is possible to manufacture an optical recording medium 26 having such guiding grooves and prepits that have such track pitch and pit pitch that are smaller than before, by (1) manufacturing the optical recording medium substrate 22 from the optical recording medium master copy 3, and (2) forming a thin-film section 24 (including a recording layer and the like) and, if necessary, a cover layer 25 and the like, on the optical recording medium substrate 22. The optical recording medium substrate 22 is manufactured by the 2P method as follows. First, as shown in FIG. 26(a), radiation curing resin 201 is applied onto the optical recording medium master copy 3. Then, as shown in FIG. 26(b), a substrate 202 is pressed against the radiation curing resin 201. In this way, the patterns on the optical recording medium master copy 3 are transferred to the radiation curing resin 201. After that, the radiation curing resin 201 is cured by radiation, so that the radiation curing resin 201 adheres to the substrate 202. Then, as shown in FIG. 26(c), the radiation curing resin 201 is separated from the optical recording medium master copy 3. As a result, the optical recording medium substrate 22 is obtained.

Embodiment 4

With reference to FIGS. 18 through 21, the following describes a method of forming a micropattern and a method of manufacturing an optical recording medium master copy that are still another embodiment of the present invention. For the purpose of explanation, members whose functions are identical to those of the members in Embodiment 1 are labeled with identical referential numerals, and explanations of such members are omitted.

Figure 18:
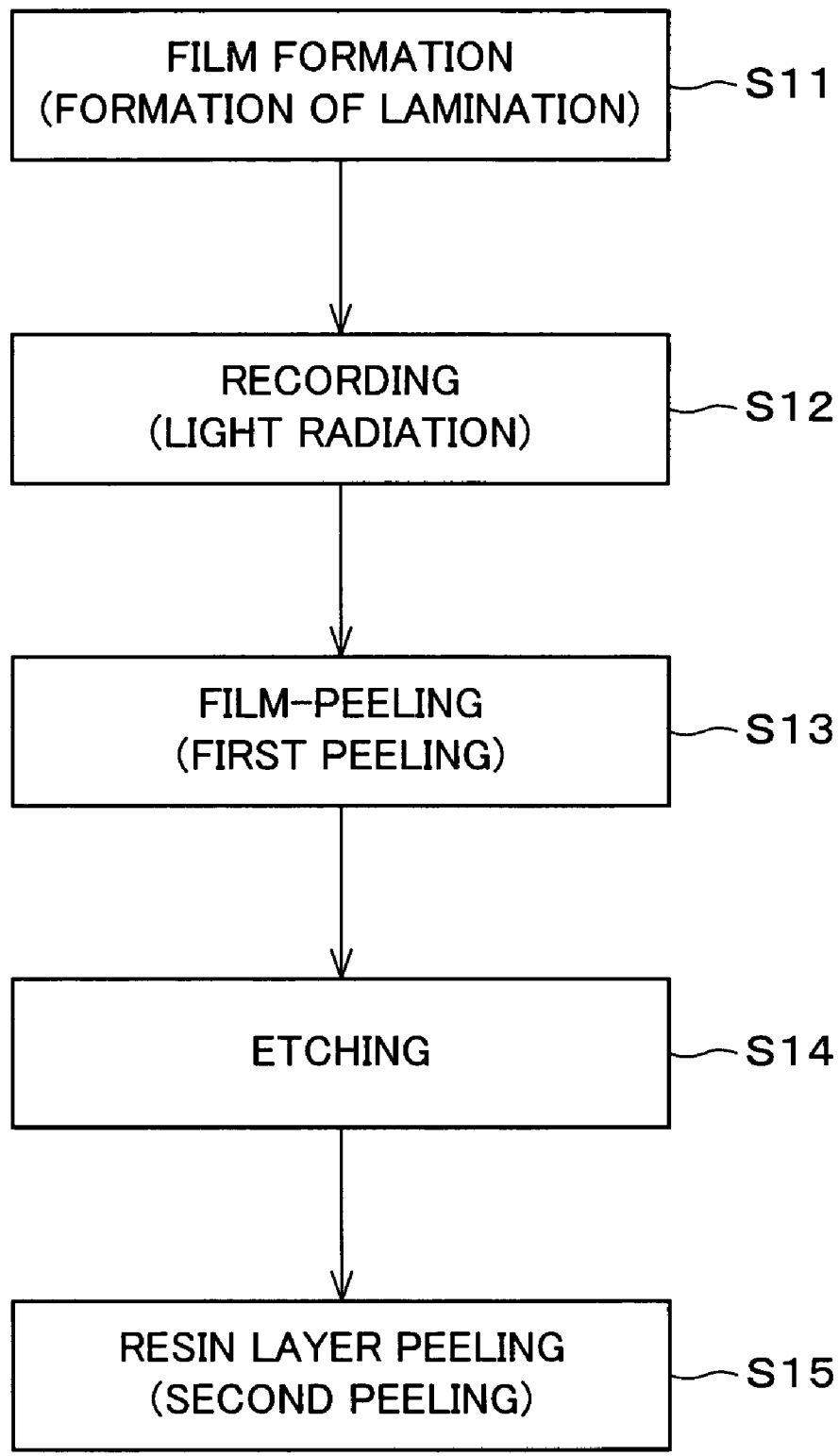
FIG. 18 is a flowchart explaining a method of forming a micropattern and a method of manufacturing an optical recording medium master copy that are of still another embodiment of the present invention.
Figure 19:
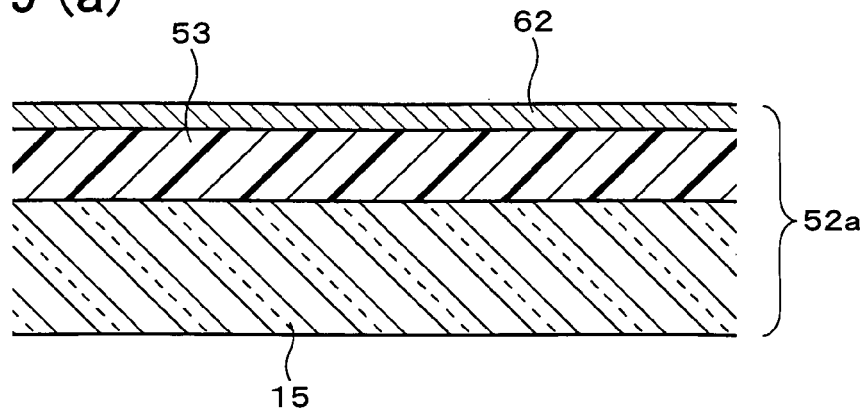
FIGS. 19(a) through 19(d) are partial cross-sectional views illustrating the optical recording medium master copy in the process of FIG. 18.
Figure 19:
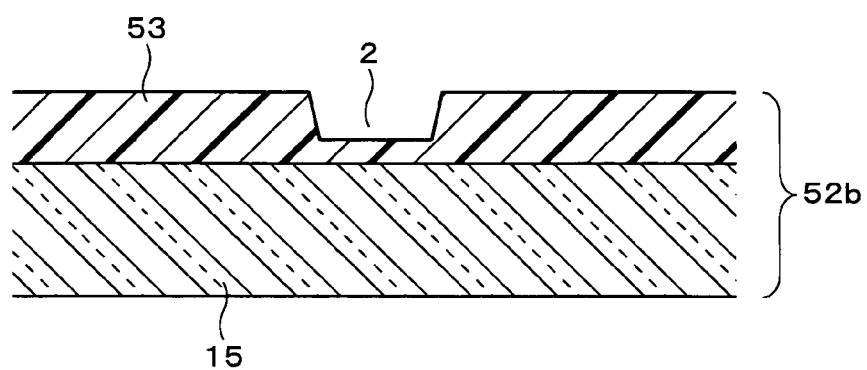
Figure 19:
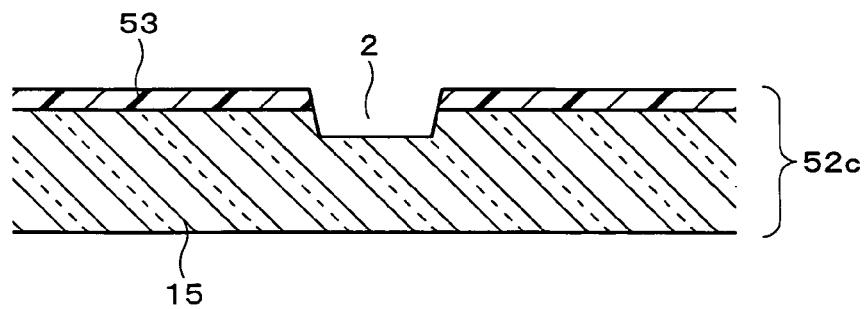
Figure 19:
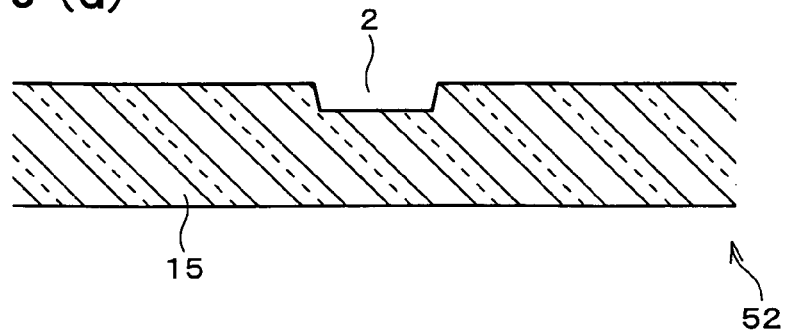

FIG. 18 is a flowchart explaining the methods of the present embodiment, i.e. the method of forming a micropattern and the method of manufacturing an optical recording medium master copy. FIG. 19(a) is a partial cross-sectional view illustrating an optical recording medium master copy 52a, which is in the course of manufacture and in such a state that a resin layer 53 and a depressed part inducing layer 62 have been laminated in this order on a glass master copy (master copy substrate; substrate) 15 as a result of the film-forming step of FIG. 18. FIG. 19(b) is a partial cross-sectional view illustrating an optical recording medium master copy 52b, in which pit parts and/or guiding grooves 2 have been formed in the resin layer 53 on the glass master copy 15 as a result of the film-peeling step of FIG. 18. FIG. 19(c) is a partial cross-sectional view illustrating an optical recording medium master copy 52c, in which the pit parts and/or guiding grooves 2 have been formed to such an extent as to reach the glass master copy 15 as a result of the etching step of FIG. 18. FIG. 19(d) is a partial cross-sectional view illustrating an optical recording medium master copy 52, in which the pit parts and/or guiding grooves 2 have been formed on the glass master copy 15 as a result of the resin layer peeling step of FIG. 18.

First, in the film-forming step S11, the resin layer 53 is formed on the glass master copy 15, and the depressed part inducing layer 62 is formed on the resin layer 53. In this way, a lamination is formed on the glass master copy 15. As a result, an optical recording medium master copy 52a is obtained.

It is preferable if the surface of the glass master copy 15 is flat. Instead of glass, diamond or sapphire can be used. However, glass is preferable in terms of cost and processability.

If the recording beam is radiated from the side of the depressed part inducing layer 62 in the recording step, the optical characteristic of the material of the glass master copy 15 is not particularly limited. Therefore, the material of the glass master copy 15 may be transparent or non-transparent. On the other hand, if the recording beam is radiated from the side of the glass master copy 15 in the recording step, it is preferable, from the viewpoint of light utilization efficiency, if the optical characteristic of the material of the glass substrate 15 is transparent at the wavelength of the recording beam, so as not to prevent the incidence of the recording beam.

If the recording beam is radiated from the side of the depressed part inducing layer 62 in the recording step, the thickness of the glass master copy 15 needs to be such a thickness (e.g. not less than 0.5 mm) as to maintain the flatness of the glass master copy 15 while the glass master copy 15 is rotating during recording in the recording step. On the other hand, if the recording beam is radiated from the side of the glass master copy 15 in the recording step, the thickness of the glass master copy 15 needs to be such a thickness that allows for focusing the recording beam at least on the depressed part inducing layer 62 during recording, in addition to the foregoing limitation. For example, the larger the numerical aperture NA of the laser recording device is, the thinner the glass master copy 15 needs to be.

On the inner surface (the surface closer to the resin layer 53) of the glass master copy 15, (i) pits corresponding to information to be recorded and/or (ii) guiding grooves may be formed in advance.

Like the resin substrate 61 of Embodiment 1, the optical characteristic of the material of the resin layer 53 may be transparent or non-transparent, with no particular limitation.

Like the resin substrate 61 of Embodiment 1, the material of the resin layer 53 is not particularly limited, but it is preferable if an organic compound is used. Examples of the organic compound are (i) thermoplastic transparent resin (plastic) such as polyolefin resin, polycarbonate, thermoplastic polyimide, PET (polyethylene terephthalate), PEN (polyethernitrile), and PES (polyethersulfone); (ii) thermosetting transparent resin such as thermosetting polyimide and ultraviolet-curable acrylic resin; and (iii) a combination of these compounds.

In Embodiment 1, the resin substrate 61 needs to have appropriate strength, because the resin substrate 61 does not have the glass master copy 15. Therefore, the material of the resin substrate (resin layer) 61 needs to be chosen so as to attain appropriate strength. However, in the present embodiment, the material of the resin layer 53 is not limited in terms of strength, because the glass master copy 15 is provided. Therefore, the material of the resin layer 53 may be photoresist or the like, preferably photoresist or polyolefin resin. Note that the "photoresist" referred to here is a kind of resin.

If the glass master copy 15 is not provided, the thickness of the resin layer 53 needs to be such a thickness as to attain strength. However, such a limitation is not placed in the present embodiment. Therefore, an appropriate thickness of the resin layer 53 is, for example, 0.02 μm to 3.0 μm, considering the necessity of transferring the pit parts and/or guiding grooves 2 (which are formed in the resin layer 53) to the glass master copy 15 in the later dry etching step.

Next, in the recording step S12, the recording beam, which has been emitted from a light source and intensity-modulated by recording signals, is focused at least on the depressed part inducing layer 62 of the optical recording medium master copy 52a. The recording beam is focused through an object lens, while the optical recording medium master copy 52a is rotating. At this time, heat is generated in those parts of the depressed part inducing layer 62 irradiated by the recording beam. As a result, latent images respectively corresponding to the recording signals are formed on the resin layer 53. The focused recording beam has a focal depth (generally represented by $\lambda/(NA \times NA)$; for example, the focal depth is about 1 μm if $\lambda=408$ nm, NA=0.65, and is about 300 nm if $\lambda=257$ nm, NA=0.9). Therefore, if a part of the depressed part inducing layer 62 is within the focal depth, the recording beam is focused on the depressed part inducing layer 62.

The recording beam may be radiated from the side of the glass master copy 15, or from the side of the depressed part inducing layer 62.

Next, in the film-peeling step S13, the depressed part inducing layer 62 is peeled off the glass master copy 15 and the resin layer 53. The method of peeling is not particularly limited, as long as the depressed part inducing layer 62 can be peeled off selectively and completely. For example, it is possible to peel off the depressed part inducing layer 62 by soaking it in a solution to which the glass master copy 15 and the resin layer 53 are insoluble but the depressed part inducing layer 62 is soluble. Examples of such a solution are NaOH or the like alkaline solution and $HNO_3$, $H_2SO_4$, or the like acid solution. When the depressed part inducing layer 62 is peeled off, the surface of the resin layer 53 is exposed. As a result, the pit parts and/or guiding grooves 2 formed in the previous recording step in the resin layer 53 are exposed. Thus obtained is the optical recording medium master copy 52b, in which the pit parts and/or guiding grooves (micropatterns) 2 have been formed in the resin layer 53 on the glass master copy 15.

In the present embodiment, the etching step S14 is performed immediately after of the film-peeling step S13. However, the optical recording medium master copy 52b, which is obtained as a result of the film-peeling step S13, may be used as the optical recording medium master copy as in Embodiment 1. In this case, because the glass master copy 15 is provided under the resin layer 53, the optical recording medium master copy 52a can rotate during recording more stably without wobbling than in the case of the resin substrate 61. As a result, it is possible to form pit parts and/or guiding grooves (micropatterns) 2 that are more uniform than those of Embodiment 1.

In the etching step S14, etching is performed on the optical recording medium master copy 52b. In this way, the pit parts and/or guiding grooves 2 formed in the resin layer 53 is transferred to the glass master copy 15. The etching is preferably performed only in the depth direction, so as to maintain the size of the pit parts and/or guiding grooves 2. Therefore, it is preferable if the etching is anisotropic dry etching. The condition of etching in this step determines the depth of the pit parts and/or guiding grooves 2 in the optical recording medium master copy 52c or the optical recording medium master copy 52. Therefore, the etching is performed under a condition that corresponds to a desired depth.

In this way, the optical recording medium master copy 52c, in which the pit parts and/or guiding grooves (micropatterns) 2 have been formed on the glass master copy 15, is obtained. In the present embodiment, the resin layer 53 is not completely removed in the etching step S14, and the resin layer peeling step S15 is performed subsequently. However, the resin layer 53 may be completely removed in the etching step S4. In this case, the optical recording medium master copy from which the resin layer 53 has been completely removed is used as the optical recording medium master copy as in Embodiment 1. Alternatively, the optical recording medium master copy 52c, which is still provided with the resin layer 53, may be used as the optical recording medium master copy as in Embodiment 1. In either case, the pit parts and/or guiding grooves 2 are formed in the glass master copy 15. Therefore, it is possible to form such micropatterns that are highly stable even if environmental conditions such as temperature and moisture change.

In the resin layer peeling step S15, the resin layer 53 that remains on the glass master copy 15 is peeled off after the etching step S14. The resin layer 53 may be peeled off by any method, as long as only the resin layer 53 is removed selectively. For example, the resin layer 53 can be peeled off by soaking it in a solution to which the glass master copy 15 is insoluble but the resin layer 53 is soluble. Examples of such a solution are NaOH or the like alkaline solution and acetone or the like organic solution. In this way, the pit parts and/or guiding grooves (micropatterns) 2 are formed on the glass master copy 15. As a result, an optical recording medium master copy 52 is obtained.

If the resin layer peeling step is thus performed, the number of steps is larger than in the case where (i) the resin layer 53 is completely peeled off in the etching step or (ii) processing is terminated without completely removing the resin layer 53. However, it is possible to preserve inherent flatness of the glass master copy 15. Therefore, the pit parts and/or guiding grooves (micropatterns) 2 can be formed more flatly. On the other hand, if the resin layer 53 is peeled off in the etching step, the surface of the glass master copy 15 is damaged by etching. As a result, the inherent flatness of the glass master copy 15 is ruined.

Described below is an example of the methods of the present embodiment, i.e. the method of forming a micropattern and the method of manufacturing an optical recording medium master copy.

EXAMPLE 5

First, in the film-forming step S11, a photoresist film (resin layer 53; thickness: on the order of 40 nm) is applied by spin coating on a glass master copy 15 (thickness: on the order of 1.2 mm). Then, a ZnO film (depressed part inducing layer 62; thickness: on the order of 30 nm) is formed by magnetron sputtering. In this way, an optical recording medium master copy (lamination) 52a is formed.

Next, in the recording step S12, recording is carried out by focusing the recording beam (wavelength: 257 nm), which has been intensity-modulated by the recording signals, on the ZnO film (depressed part inducing layer 62) of the optical recording medium master copy 52a. The recording beam is focused through an object lens (numerical aperture NA: 0.9), while the optical recording medium master copy 52a is rotating at a linear velocity of 1.0 m/s. The recording beam is radiated from the side of the depressed part inducing layer 62.

The diameter of the light beam spot of the focused recording beam is approximately 230 nm, according to the formula 0.8λ/NA. In order to record information, a rectangular wave having a frequency of 3.57 MHz (linear velocity: 1.0 m/s; pit pitch: 0.28 μm) is used as recording signals. The duty of the rectangular wave is 35%. On the optical recording medium master copy 52a, the beam power intensity of the recording beam is 0 mW when the rectangular wave is low, and 1.6 mW when the rectangular wave is high.

Next, in the film-peeling step S13, the optical recording medium master copy 52a is soaked in an $HNO_3$ solution (concentration: about 15%) for about two minutes. In this way, the ZnO film (depressed part inducing layer 62) dissolves in the $HNO_3$ solution, and is peeled off the photoresist (resin layer 53). As a result, recording marks (pits; micropatterns) respectively corresponding to the recording signals are formed on the resin layer 53 on the glass master copy 15. As a result, an optical recording medium master copy 52b is obtained. After that, the optical recording medium master copy 52b is cleaned with purified water, and baked at 95° C. for about ten minutes. Thus, an optical recording medium master copy 52c is formed.

In the present example, the etching step S14 and the resin layer peeling step S15 are not performed.

Figure 20:
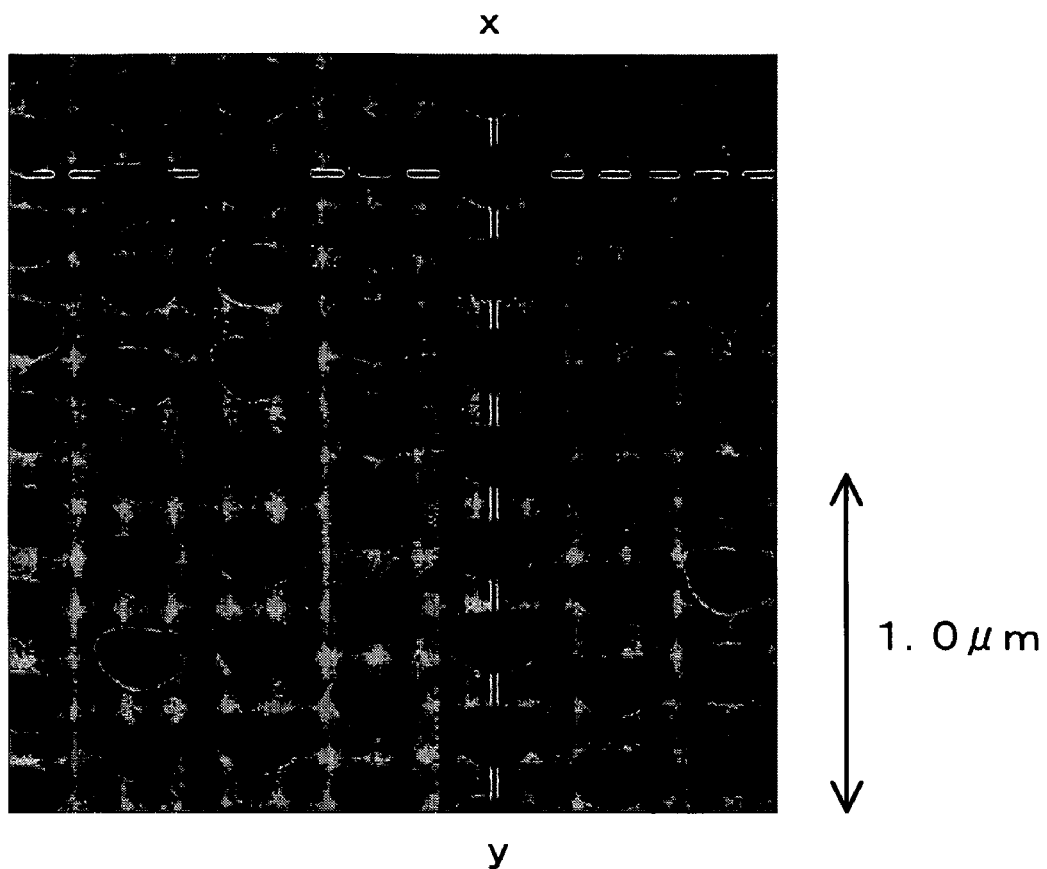
FIG. 20 is an image of the surface, on which prepits are formed, of an optical recording medium master copy of further example of the present invention.
Figure 21:
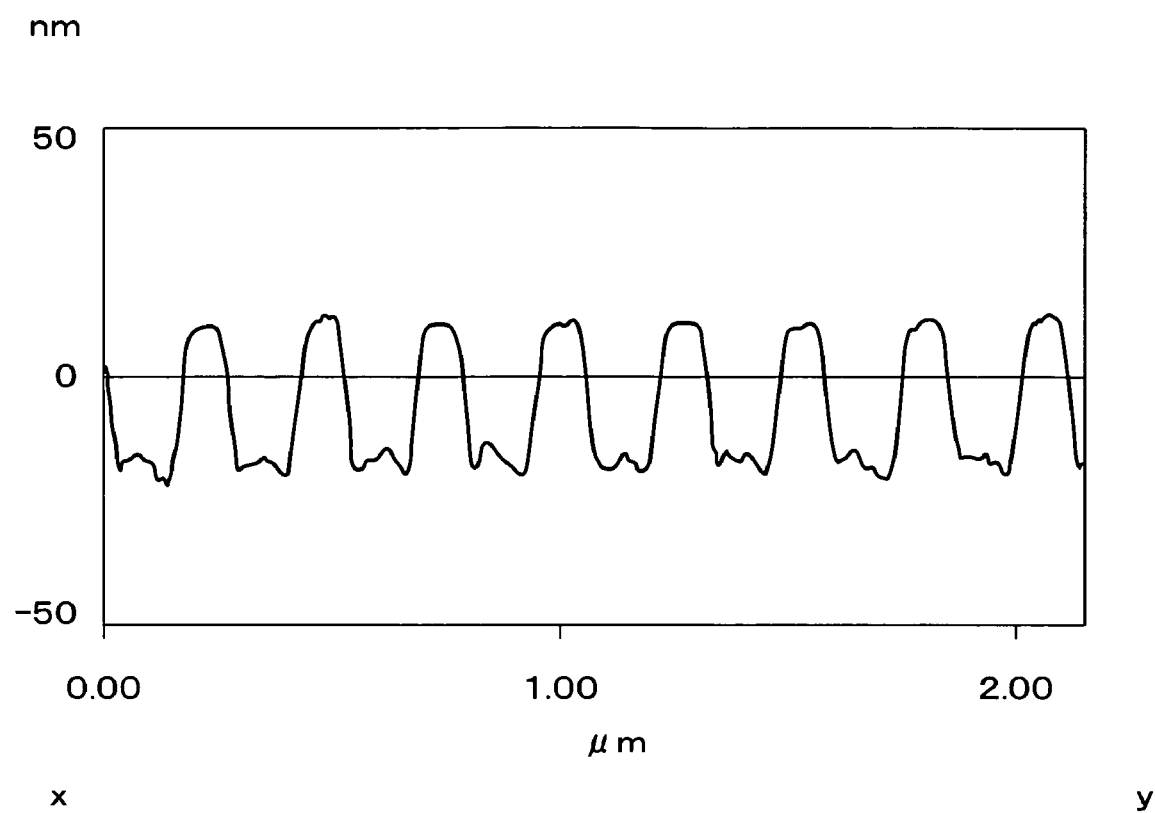
FIG. 21 is a cross-sectional view taken along the solid line x-y on the image of FIG. 20.
Figure 22:
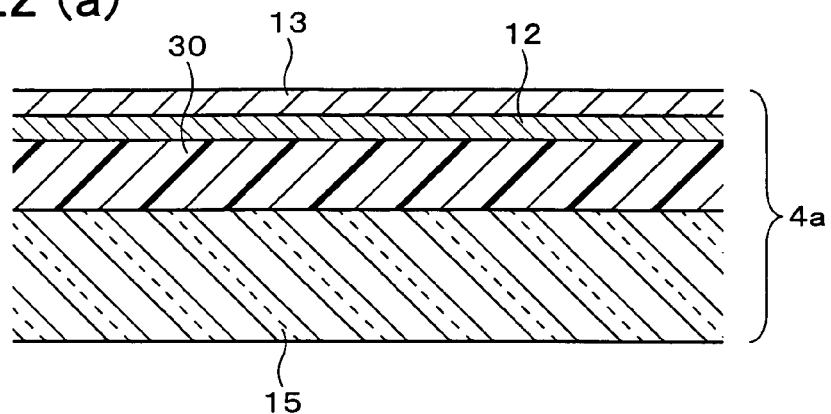
FIGS. 22(a) through 22(d) are partial cross-sectional views of an optical recording medium master copy in the manufacturing process, illustrating a method of forming a micropattern and a method of manufacturing an optical recording medium master copy that are of further embodiment of the present invention.
Figure 22:
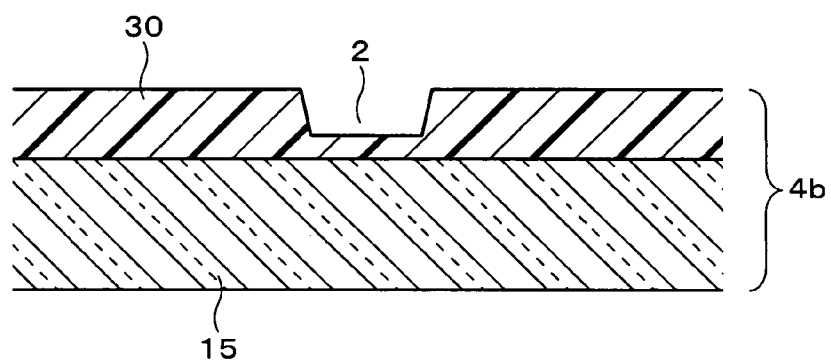
Figure 22:
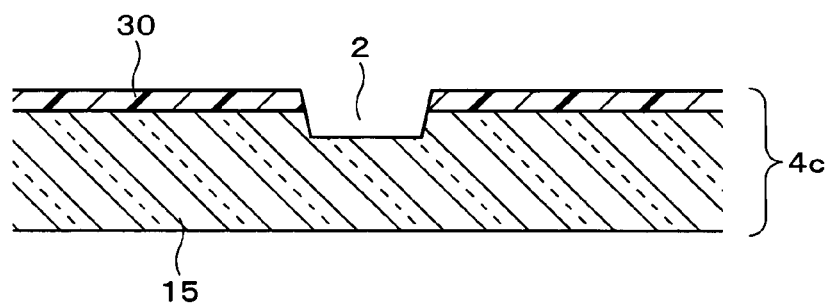
Figure 22:
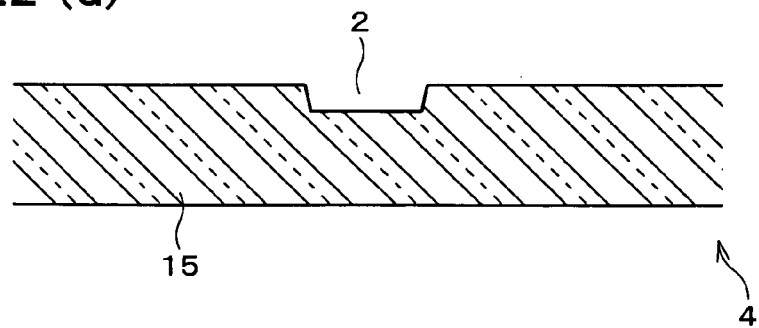

FIG. 20 is an AFM image (plan view) of such a part of the optical recording medium master copy 52c where the pits are formed. In the part shown in FIG. 20, the pits are formed at a pit pitch of 0.28 μm. In FIG. 20, the black circular marks are the pits. FIG. 21 is a cross-sectional view taken along the solid line x-y on the plan view of FIG. 21.

As shown in FIGS. 20 and 21, at the pit pitch of 0.28 μm, the pits having a pit length of about 160 nm and a pit depth of about 30 nm are formed almost uniformly.

As described above, by using the methods of the present embodiment, i.e. the method of forming a micropattern and the method of manufacturing an optical recording medium master copy, it is possible, as in Embodiments 1 through 3, to form guiding grooves and prepits having such track pitch and pit pitch that are smaller than before, and to manufacture an optical recording medium master copy having the guiding grooves and prepits.

Moreover, as in Embodiments 1 through 3, it is possible to form small guiding grooves and prepits by a currently available and relatively inexpensive laser recording device (see, for example, FIG. 5) using a light source of 240 nm to 700 nm, without requiring an expensive device such as the device used in carrying out the electron beam method disclosed in publication 2.

Furthermore, by using the methods of the present embodiment, i.e. the method of forming a micropattern and the method of manufacturing an optical recording medium master copy, the optical recording medium master copy 52a can rotate stably without wobbling in the recording step, because the resin layer 53a is provided on the glass master copy 15. Therefore, the pit parts and/or guiding grooves 2 can be formed more uniformly than in the case where the resin substrate 61 is used. As a result, it is possible to reduce the error rate of reproduced signals.

Moreover, because the pit parts and/or guiding grooves 2 formed in the resin layer 53 are transferred to the glass master copy 15 by etching, the pit parts and/or guiding grooves 2 are more stable than those formed in the resin substrate 61.

In addition, because the resin layer peeling step is performed separately instead of completely removing the resin layer 53 in the etching step, it is possible to preserve the inherent flatness of the glass master copy 15. Therefore, the pit parts and/or guiding grooves 2 can be formed more flatly. Furthermore, because the depth of the glass master copy 15 at the time of etching is the depth of the depressed part, there is also an advantage that the depth of the pit parts and/or guiding grooves 2 can be set freely.

As in Embodiment 1, if Ni electroforming is performed by using the optical recording medium master copy 52b, 52c, or 52 manufactured as described above, an optical recording medium stamper can be manufactured by so-called transfer. Furthermore, by (1) using the optical recording medium stamper to produce an optical recording medium substrate, and (2) forming a thin-film section (including a recording layer and the like) on the optical recording medium substrate, it is possible to manufacture an optical recording medium that has such guiding grooves and prepits whose track pitch and pit pitch are smaller than before, and that attains a smaller error rate of reproduced signals.

Moreover, by employing a 2P (Photo-Polymer) method, it is possible to manufacture an optical recording medium 26 having such guiding grooves and prepits that have such track pitch and pit pitch that are smaller than before, by (1) manufacturing the optical recording medium substrate 22 from the optical recording medium master copy 52, 52b, or 52c, and (2) forming a thin-film section 24 (including a recording layer and the like) and, if necessary, a cover layer 25 and the like, on the optical recording medium substrate 22. The optical recording medium substrate 22 is manufactured by the 2P method as follows. First, as shown in FIG. 26(a), radiation curing resin 201 is applied onto the optical recording medium master copy 52, 52b, or 52c. Then, as shown in FIG. 26(b), a substrate 202 is pressed against the radiation curing resin 201. In this way, the patterns on the optical recording medium master copy 52, 52b, or 52c are transferred to the radiation curing resin 201. After that, the radiation curing resin 201 is cured by radiation, so that the radiation curing resin 201 adheres to the substrate 202. Then, as shown in FIG. 26(c), the radiation curing resin 201 is separated from the optical recording medium master copy 52, 52b, or 52c. As a result, the optical recording medium substrate 22 is obtained.

Embodiment 5

With reference to FIG. 18 and FIGS. 22 through 25, the following describes a method of forming a micropattern and a method of manufacturing an optical recording medium master copy that are further embodiment of the present invention. For the purpose of explanation, members whose functions are identical to those of the members in Embodiments 2 and 3 are labeled with identical referential numerals, and explanations of such members are omitted.

FIG. 18 is a flowchart explaining the methods of the present embodiment, i.e. the method of forming a micropattern and the method of manufacturing an optical recording medium master copy. FIG. 22(a) is a partial cross-sectional view illustrating an optical recording medium master copy 4a, which is in the course of manufacture and in such a state that a resin layer 30, an intermediate layer (depressed part inducing layer) 12, and a heat-absorbing layer 13 have been laminated in this order on a glass master copy (master copy substrate; substrate) 15 as a result of the film-forming step of FIG. 18. FIG. 22(b) is a partial cross-sectional view illustrating an optical recording medium master copy 4b, in which pit parts and/or guiding grooves 2 have been formed in the resin layer 30 on the glass master copy 15 as a result of the film-peeling step of FIG. 18. FIG. 22(c) is a partial cross-sectional view illustrating an optical recording medium master copy 4c, in which the pit parts and/or guiding grooves 2 have been formed to such an extent as to reach the glass master copy 15 as a result of the etching step of FIG. 18. FIG. 22(d) is a partial cross-sectional view illustrating an optical recording medium master copy 4, in which the pit parts and/or guiding grooves 2 have been formed on the glass master copy 15 as a result of the resin layer peeling step of FIG. 18.

First, in the film-forming step S11, the resin layer 30 is formed on the glass master copy 15, and the intermediate layer 12 is formed on the resin layer 30. In this way, a lamination is formed on the glass master copy 15. As a result, an optical recording medium master copy 4a is obtained.

It is preferable if the surface of the glass master copy 15 is flat. Instead of glass, diamond or sapphire can be used. However, glass is preferable in terms of cost and processability.

If the recording beam is radiated from the side of the heat-absorbing layer 13 in the recording step, the optical characteristic of the material of the glass master copy 15 is not particularly limited. Therefore, the material of the glass master copy 15 may be transparent or non-transparent. On the other hand, if the recording beam is radiated from the side of the glass master copy 15 in the recording step, it is preferable, from the viewpoint of light utilization efficiency, if the optical characteristic of the material of the glass substrate 15 is transparent at the wavelength of the recording beam, so as not to prevent the incidence of the recording beam.

If the recording beam is radiated from the side of the heat-absorbing layer 13 in the recording step, the thickness of the glass master copy 15 needs to be such a thickness (e.g. not less than 0.5 mm) as to maintain the flatness of the glass master copy 15 while the glass master copy 15 is rotating during recording in the recording step. On the other hand, if the recording beam is radiated from the side of the glass master copy 15 in the recording step, the thickness of the glass master copy 15 needs to be such a thickness that allows for focusing the recording beam at least on the heat-absorbing layer 13 during recording, in addition to the foregoing limitation. For example, the larger the numerical aperture NA of the laser recording device is, the thinner the glass master copy 15 needs to be.

On the inner surface (the surface closer to the resin layer 30) of the glass master copy 15, (i) pits corresponding to information to be recorded and/or (ii) guiding grooves may be formed in advance.

Like the resin substrate 11 of Embodiments 2 and 3, the optical characteristics of the material of the resin layer 30 may be transparent or non-transparent, with no particular limitation. However, if the recording beam is radiated from the side of the heat-absorbing layer 13 in the recording step, it is preferable, from the viewpoint of light utilization efficiency, if the optical characteristic of the material of the resin layer 30 is transparent at the wavelength of the recording beam, so as not to prevent the incidence of the recording beam, as in the case of the resin substrate 11 of Embodiments 2 and 3.

Like the resin substrate 11 of Embodiments 2 and 3, the material of the resin layer 30 is not particularly limited. Examples of the material of the resin layer 30 are (i) thermoplastic transparent resin (plastic) such as polyolefin resin, polycarbonate, thermoplastic polyimide, PET (polyethylene terephthalate), PEN (polyethernitrile), and PES (polyethersulfone); (ii) thermosetting transparent resin such as thermosetting polyimide and ultraviolet-curable acrylic resin; and (iii) a combination of these compounds. Among these examples, polyolefin resin is particularly preferable.

In Embodiments 2 and 3, the resin substrate 11 needs to have such a thickness as to give appropriate strength to the intermediate layer 12 and the heat-absorbing layer 13, because the resin substrate 11 does not have the glass master copy 15. However, this is not necessary in the case of the resin layer 30. Therefore, an appropriate thickness of the resin layer 30 is, for example, 0.02 μm to 3.0 μm, considering the necessity of transferring the pit parts and/or guiding grooves 2 (which are formed in the resin layer 30) to the glass master copy 15 in the later dry etching step.

Next, in the recording step S12, the recording beam, which has been emitted from a light source and intensity-modulated by recording signals, is focused at least on the heat-absorbing layer 13 of the optical recording medium master copy 4a. The recording beam is focused through an object lens, while the optical recording medium master copy 4a is rotating. At this time, heat is generated in those parts of the heat-absorbing layer 13 irradiated by the recording beam. As a result, latent images respectively corresponding to the recording signals are formed through the intermediate layer 12 on the resin layer 30. The focused recording beam has a focal depth (generally represented by $\lambda/(NA \times NA)$; for example, the focal depth is about 1 μm if $\lambda=408$ nm, NA=0.65, and is about 300 nm if $\lambda=257$ nm, NA=0.9). Therefore, if a part of the heat-absorbing layer 13 is within the focal depth, the recording beam is focused on the heat-absorbing layer 13.

The recording beam may be radiated from the side of the glass master copy 15, or from the side of the heat-absorbing layer 13. However, for the following reason, it is preferable if the recording beam is radiated from the side of the glass master copy 15. If the recording beam is radiated from the side of the glass master copy 15, the heat generated in the heat-absorbing layer 13 is easily transmitted to the intermediate layer 12, and, because the recording beam is transmitted through the intermediate layer 12, the intermediate layer 12 generates heat by absorbing the recording beam. Therefore, radiating the recording beam from the side of the glass master copy 15 is more advantageous than radiating the recording beam from the side of the heat-absorbing layer 13 in the following respects: (1) the shapes of the pit parts and/or guiding grooves 2 are more uniform after the film-peeling step, and (2) recording can be carried out at lower power.

Next, in the film-peeling step S13, the intermediate layer 12 and the heat-absorbing layer 13 are peeled off the glass master copy 15 and the resin layer 30. The method of peeling is not particularly limited, as long as the intermediate layer 12 and the heat-absorbing layer 13 can be peeled off selectively and completely. For example, it is possible to peel off the intermediate layer 12 and the heat-absorbing layer 13 by soaking them in a solution to which the glass master copy 15 and the resin layer 30 are insoluble but the intermediate layer 12 and the heat-absorbing layer 13 are soluble. Examples of such a solution are NaOH or the like alkaline solution and $HNO_3$, $H_2SO_4$, or the like acid solution. Again, it is not necessary to peel off both the intermediate layer 12 and the heat-absorbing layer 13. If the intermediate layer 12 (which is adjacent to the resin layer 30) is peeled off the resin layer 30, the heat-absorbing layer 13 (which is provided on the intermediate layer 12) is simultaneously peeled off. Therefore, it is sufficient if the intermediate layer 12 is peeled off. When the intermediate layer 12 and the heat-absorbing layer 13 are peeled off, the surface of the resin layer 30 is exposed. As a result, the pit parts and/or guiding grooves 2 formed in the resin layer 30 in the previous recording step are exposed. Thus obtained is the optical recording medium master copy 4b, in which the pit parts and/or guiding grooves (micropatterns) 2 have been formed in the resin layer 30 on the glass master copy 15.

In the present embodiment, the etching step S14 is performed immediately after the film-peeling step S13. However, the optical recording medium master copy 4b, which is obtained as a result of the film-peeling step S13, may be used as the optical recording medium master copy as in Embodiments 2 and 3. In this case, because the glass master copy 15 is provided under the resin layer 30, the optical recording medium master copy 4a can rotate during recording more stably without wobbling than in the case of the resin substrate 11. As a result, it is possible to form pit parts and/or guiding grooves (micropatterns) 2 that are more uniform than those of Embodiments 2 and 3.

In the etching step S14, etching is performed on the optical recording medium master copy 4b. In this way, the pit parts and/or guiding grooves 2 formed in the resin layer 30 are transferred to the glass master copy 15. The etching is preferably performed only in the depth direction, so as to maintain the size of the pit parts and/or guiding grooves 2. Therefore, it is preferable if the etching is anisotropic dry etching. The condition of etching in this step determines the depth of the pit parts and/or guiding grooves 2 in the optical recording medium master copy 4c or the optical recording medium master copy 4. Therefore, the etching is performed under a condition that corresponds to a desired depth.

In this way, the optical recording medium master copy 4c, in which the pit parts and/or guiding grooves (micropatterns) 2 have been formed on the glass master copy 15, is obtained. In the present embodiment, the resin layer 30 is not completely removed in the etching step S14, and the resin layer peeling step S15 is performed subsequently. However, the resin layer 53 may be completely removed in the etching step S14. In this case, the optical recording medium master copy from which the resin layer 30 has been completely removed is used as the optical recording medium master copy as in Embodiments 2 and 3. Alternatively, the optical recording medium master copy 4c, which is still provided with the resin layer 30, may be used as the optical recording medium master copy as in Embodiment 1. In either case, the pit parts and/or guiding grooves 2 are formed in the glass master copy 15. Therefore, it is possible to form such micropatterns that are highly stable even if environmental conditions such as temperature and moisture change.

In the resin layer peeling step S15, the resin layer 30 that remains on the glass master copy 15 is peeled off after the etching step S14. The resin layer 30 may be peeled off by any method, as long as only the resin layer 30 is removed selectively. For example, the resin layer 30 can be peeled off by soaking it in a solution to which the glass master copy 15 is insoluble but the resin layer 30 is soluble. An example of such a solution is acetone or the like organic solution. In this way, the pit parts and/or guiding grooves (micropatterns) 2 are formed on the glass master copy 15. As a result, the optical recording medium master copy 4 is obtained.

If the resin layer peeling step is thus performed, the number of steps is larger than in the case where (i) the resin layer 30 is completely peeled off in the etching step or (ii) processing is terminated without completely removing the resin layer 30. However, it is possible to preserve inherent flatness of the glass master copy 15. Therefore, the pit parts and/or guiding grooves (micropatterns) 2 can be formed more flatly. On the other hand, if the resin layer 30 is peeled off in the etching step, the surface of the glass master copy 15 is damaged by etching. As a result, the inherent flatness of the glass master copy 15 is ruined.

As described above, by using the methods of the present embodiment, i.e. the method of forming a micropattern and the method of manufacturing an optical recording medium master copy, it is possible, as in Embodiments 1 through 4, to form guiding grooves and prepits having such track pitch and pit pitch that are smaller than before, and to manufacture an optical recording medium master copy having the guiding grooves and prepits.

Moreover, as in Embodiments 1 through 4, it is possible to form small guiding grooves and prepits by a currently available and relatively inexpensive laser recording device (see, for example, FIG. 5) using a light source of 240 nm to 700 nm or a light source of 350 nm to 450 nm, without requiring an expensive device such as the device used in carrying out the electron beam method disclosed in publication 2.

Furthermore, by using the methods of the present embodiment, i.e. the method of forming a micropattern and the method of manufacturing an optical recording medium master copy, the optical recording medium master copy 4a can rotate stably without wobbling in the recording step, because the resin layer 30 is provided on the glass master copy 15. Therefore, the pit parts and/or guiding grooves 2 can be formed more uniformly than in the case where the resin substrate 11 is used. As a result, it is possible to reduce the error rate of reproduced signals.

Moreover, because the pit parts and/or guiding grooves 2 formed in the resin layer 30 are transferred to the glass master copy 15 by etching, the pit parts and/or guiding grooves 2 are more stable than those formed in the resin substrate 11. Furthermore, because the depth of the glass master copy 15 at the time of etching is the depth of the depressed part, there is also an advantage that the depth of the pit parts and/or guiding grooves 2 can be set freely.

In addition, because the resin layer peeling step is performed separately instead of completely removing the resin layer 30 in the etching step, it is possible to preserve the original flatness of the glass master copy 15. Therefore, the pit parts and/or guiding grooves 2 can be formed more flatly.

The condition of etching in this step determines the depth of the pit parts and/or guiding grooves 2 in the optical recording medium master copy 4. Therefore, the etching is performed under a condition that corresponds to a desired depth.

Described below is an example of the methods of the present embodiment, i.e. the method of forming a micropattern and the method of manufacturing an optical recording medium master copy.

EXAMPLE 6

First, in the film-forming step S11, a photoresist film (resin layer 30; thickness: on the order of 40 nm) is applied by spin coating on a glass master copy 15 (thickness: on the order of 1.2 mm). Then, a ZnO film (intermediate layer 12; thickness: on the order of 30 nm) and an Si film (heat-absorbing layer 13; thickness: on the order of 10 nm) are formed by magnetron sputtering. In this way, an optical recording medium master copy (lamination) 4a is formed.

Next, in the recording step S12, recording is carried out by focusing the recording beam (wavelength: 257 nm), which has been intensity-modulated by the recording signals, on the Si film (heat-absorbing layer 13) of the optical recording medium master copy 5a. The recording beam is focused through an object lens (numerical aperture NA: 0.9), while the optical recording medium master copy 5a is rotating at a linear velocity of 1.0 m/s. The recording beam is radiated from the side of the heat-absorbing layer 13.

The diameter of the light beam spot of the focused recording beam is approximately 230 nm, according to the formula $0.8\lambda/NA$. In order to record information, a rectangular wave having a frequency of 6.25 MHz (linear velocity: 11.0 m/s; pit pitch: 0.16 μm) is used as recording signals. The duty of the rectangular wave is 35%. On the optical recording medium master copy 4a, the beam power intensity of the recording beam is 0 mW when the rectangular wave is low, and 2.5 mW when the rectangular wave is high.

Next, in the film-peeling step S13, the optical recording medium master copy 4a is soaked in an $HNO_3$ solution (concentration: about 15%) for about five minutes. In this way, the ZnO film (intermediate layer 12) dissolves in the $HNO_3$ solution, and is peeled off the photoresist (resin layer 30). As a result, recording marks (pits; micropatterns) respectively corresponding to the recording signals are formed on the resin layer 30 on the glass master copy 15. As a result, an optical recording medium master copy 4b is obtained. After that, the optical recording medium master copy 4b is cleaned with purified water, and baked at 95° C. for about ten minutes. Thus, an optical recording medium master copy 4 is formed.

In the present example, the etching step S14 and the resin layer peeling step S15 are not performed.

Figure 23:
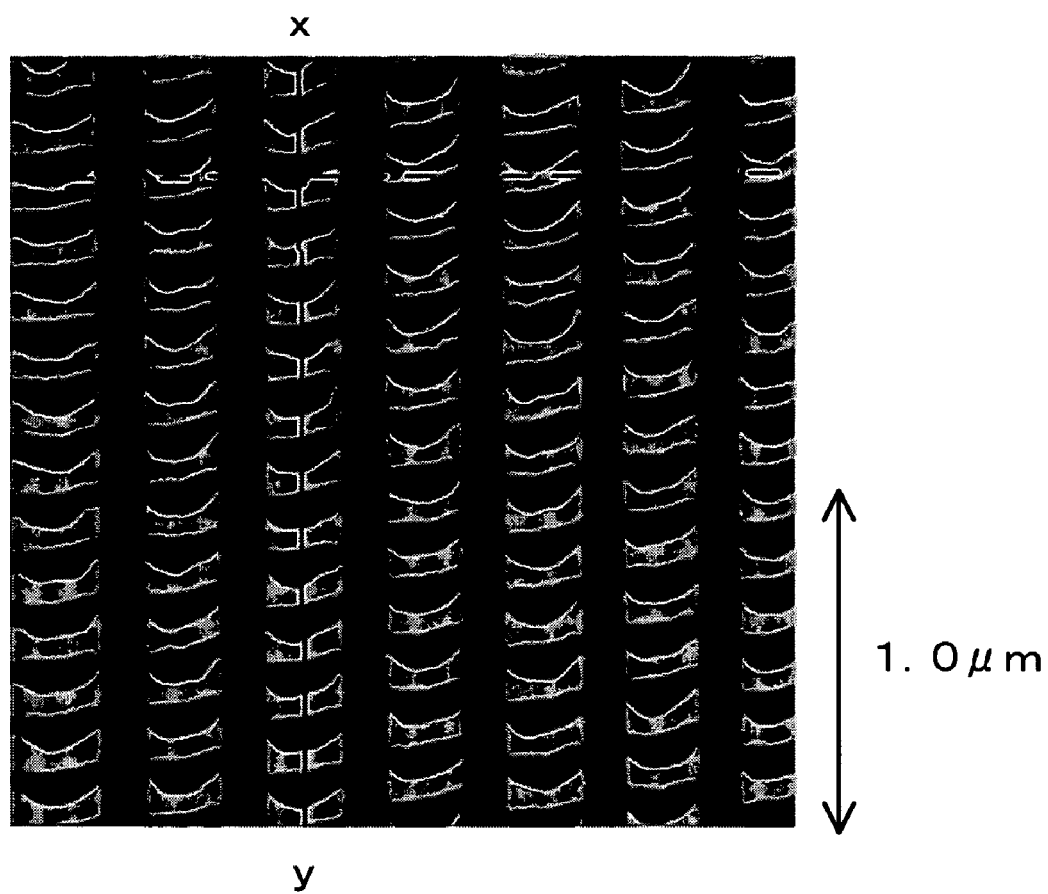
FIG. 23 is an image of the surface, on which prepits are formed, of an optical recording medium master copy of another further example of the present invention.
Figure 24:
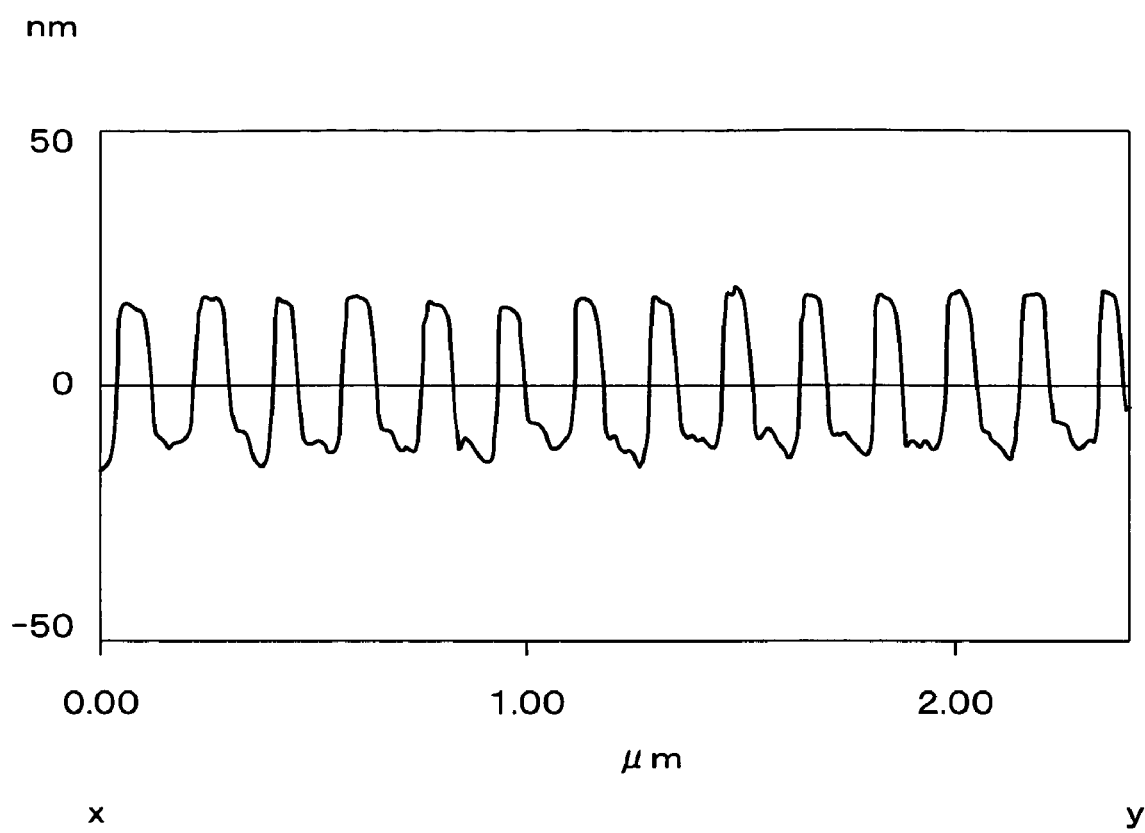
FIG. 24 is a cross-sectional view taken along the solid line x-y on the image of FIG. 23.
Figure 25:
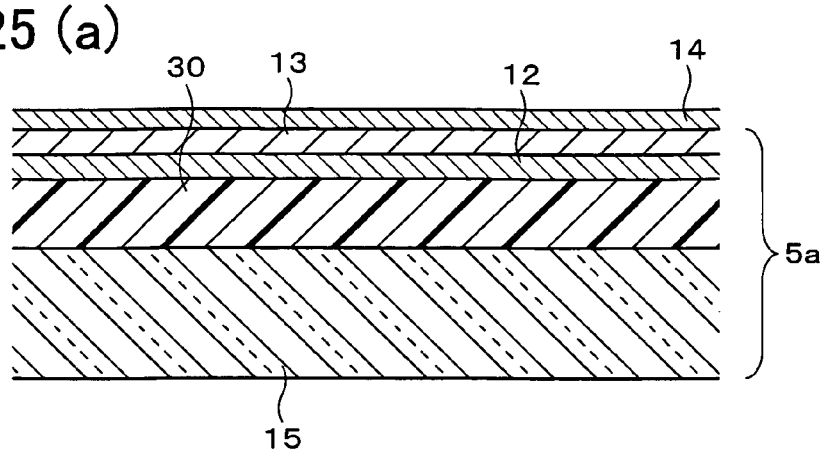
FIGS. 25(a) through 25(d) are partial cross-sectional views of an optical recording medium master copy in the manufacturing process, illustrating a method of forming a micropattern and a method of manufacturing an optical recording medium master copy that are of further embodiment of the present invention.
Figure 25:
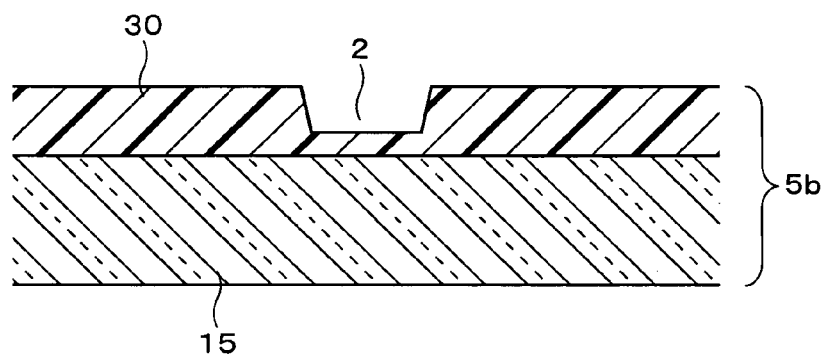
Figure 25:
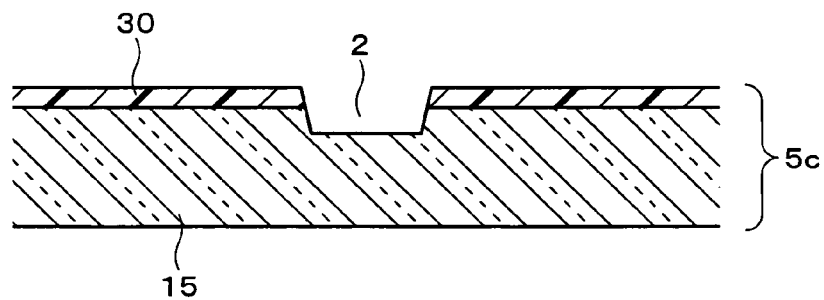
Figure 25:
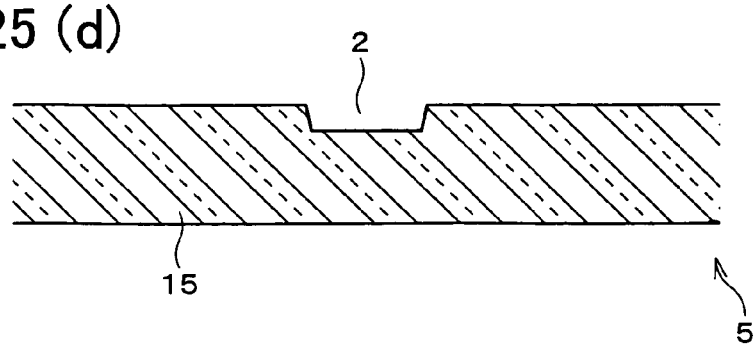

FIG. 23 is an AFM image (plan view) of such a part of the optical recording medium master copy 4 where the pits are formed. In the part shown in FIG. 23, the pits are formed at a pit pitch of 0.16 μm. In FIG. 23, the black circular marks are the pits. FIG. 24 is a cross-sectional view taken along the solid line x-y on the plan view of FIG. 23.

As shown in FIGS. 23 and 24, at the pit pitch of 0.16 μm, the pits having a pit length of about 80 nm and a pit depth of about 25 nm are formed almost uniformly.

As described above, according to the methods of the present embodiment, i.e. the method of forming a micropattern and the method of manufacturing an optical recording medium master copy, the heat-absorbing layer 13 is formed on the intermediate layer 12 in the film-forming step S1. Due to the presence of the heat-absorbing layer 13, heat is generated more efficiently than in Embodiment 4 upon radiation of the recording beam. Therefore, a larger amount of heat is transmitted to the intermediate layer 12. Therefore, the shapes of the pit parts and/or guiding grooves 2 are more uniform.

Moreover, as in Embodiments 1 through 4, it is possible to form small guiding grooves and prepits by a currently available and relatively inexpensive laser recording device (see, for example, FIG. 5) using a light source of 240 nm to 700 nm, without requiring an expensive device such as the device used in carrying out the electron beam method disclosed in publication 2.

Furthermore, by using the methods of the present embodiment, i.e. the method of forming a micropattern and the method of manufacturing an optical recording medium master copy, the optical recording medium master copy 4a can rotate stably without wobbling in the recording step, because the resin layer 30 is provided on the glass master copy 15. Therefore, the pit parts and/or guiding grooves 2 can be formed more uniformly than in the case where the resin substrate 11 is provided. As a result, it is possible to reduce the error rate of reproduced signals.

Moreover, because the pit parts and/or guiding grooves 2 formed in the resin layer 30 are transferred to the glass master copy 15 by etching, the pit parts and/or guiding grooves 2 are more stable than those formed in the resin substrate 11.

In addition, because the resin layer peeling step is performed separately instead of completely removing the resin layer 30 in the etching step, it is possible to preserve the inherent flatness of the glass master copy 15. Therefore, the pit parts and/or guiding grooves 2 can be formed more flatly. Furthermore, because the depth of the glass master copy 15 at the time of etching is the depth of the depressed part, there is also an advantage that the depth of the pit parts and/or guiding grooves 2 can be set freely.

Although the metal layer 14 is not formed in the present embodiment, the metal layer 14 may be formed as in Embodiment 3 after the resin layer 30, the intermediate layer 12, and the heat-absorbing layer 13 are formed in this order on the glass master copy 15, as shown in FIGS. 25(a) through 25(b). With this arrangement, the explosion of the heat-absorbing layer 13 is prevented. Therefore, it is possible to form the pit parts and/or guiding grooves in more uniform shapes on the glass master copy 15.

FIG. 25(a) is a partial cross-sectional view illustrating an optical recording medium master copy 5a, which is in the course of manufacture and in such a state that the resin layer 30, the intermediate layer 13, and the metal layer 14 have been laminated in this order on a glass master copy (master copy substrate; substrate) 15 as a result of the film-forming step of FIG. 18. FIG. 25(b) is a partial cross-sectional view illustrating an optical recording medium master copy 5b, in which pit parts and/or guiding grooves 2 have been formed in the resin layer 30 on the glass master copy 15 as a result of the film-peeling step of FIG. 18. FIG. 25(c) is a partial cross-sectional view illustrating an optical recording medium master copy 5c, in which the pit parts and/or guiding grooves 2 have been formed to such an extent as to reach the glass master copy 15 as a result of the etching step of FIG. 18. FIG. 25(d) is a partial cross-sectional view illustrating an optical recording medium master copy 5, in which the pit parts and/or guiding grooves 2 have been formed on the glass master copy 15 as a result of the resin layer peeling step of FIG. 18.

Because the metal layer 14 is provided, the solution used in the peeling step S13 is such a solution (1) to which the glass master copy 15 and the resin layer 30 are insoluble, and (2) that can peel off the intermediate layer 12, the heat-absorbing layer 13, and the metal layer 14 selectively and completely (again, it is not necessary to dissolve all of the intermediate layer 12, the heat-absorbing layer 13, and the metal layer 14; it is sufficient if the intermediate layer 12 can be peeled off the resin layer 30, because the heat-absorbing layer 13 and the metal layer 14, which are provided on the intermediate layer 12, are peeled of simultaneously when the intermediate layer 12 is peeled off the resin layer 13). Other than this point, the foregoing explanation made with reference to FIGS. 22(a) through 22(d) also applies to this case. Further explanation is therefore omitted.

As in Embodiment 1, if Ni electroforming is performed by using the optical recording medium master copy 5b, 5c, or 5 manufactured as described above, an optical recording medium stamper can be manufactured by so-called transfer. Furthermore, by (1) using the optical recording medium stamper to produce an optical recording medium substrate, and (2) forming a thin-film section (including a recording layer and the like) on the optical recording medium substrate, it is possible to manufacture an optical recording medium that has such guiding grooves and prepits whose track pitch and pit pitch are smaller than before, and that attains a smaller error rate of reproduced signals.

Moreover, by employing a 2P (Photo-Polymer) method, it is possible to manufacture an optical recording medium 26 having such guiding grooves and prepits that have such track pitch and pit pitch that are smaller than before, by (1) manufacturing the optical recording medium substrate 22 from the optical recording medium master copy 5, 5b, or 5c, and (2) forming a thin-film section 24 (including a recording layer and the like) and, if necessary, a cover layer 25 and the like, on the optical recording medium substrate 22. The optical recording medium substrate 22 is manufactured by the 2P method as follows. First, as shown in FIG. 26(a), radiation curing resin 201 is applied onto the optical recording medium master copy 5, 5b, or 5c. Then, as shown in FIG. 26(b), a substrate 202 is pressed against the radiation curing resin 201. In this way, the patterns on the optical recording medium master copy 5, 52, or 5c are transferred to the radiation curing resin 201. After that, the radiation curing resin 201 is cured by radiation, so that the radiation curing resin 201 adheres to the substrate 202. Then, as shown in FIG. 26(c), the radiation curing resin 201 is separated from the optical recording medium master copy 5, 5b, or 5c. As a result, the optical recording medium substrate 22 is obtained.

The present invention is not limited to the foregoing Embodiments; various modifications may be made within the scope of the claims. For example, the method of forming a micropattern and the method of manufacturing an optical recording medium master copy are applicable not only to the case where the optical recording medium is an optical disk, but also to the case where the optical recording medium has a shape of a card or a sheet. Likewise, manufacturing an optical recording medium master copy is not the only use of the method of manufacturing a micropattern. The method of manufacturing a micropattern is applicable to various technologies, such as a semiconductor element manufacturing mask, as long as the technologies involve microfabrication using exposure by a light beam.

Finally, the following discusses the mechanism by which a depressed part is formed in the resin layer when a lamination is formed by laminating at least (i) a resin layer and (ii) a depressed part inducing layer, which is made of dielectric material or metal oxide, and then a light beam is radiated and focused onto at least the depressed part inducing layer of the lamination.

As mentioned earlier, the mechanism is not known in detail. Initially, the inventors of the present invention found that, by laminating (i) a resin layer, (ii) an intermediate layer made of dielectric material or metal oxide, and (iii) a heat-absorbing layer that generates heat when irradiated by a light beam, in this order to form a lamination, and radiating and focusing a light beam on the heat-absorbing layer of the lamination, a depressed part is formed in the resin layer. The inventors of the present invention supposed that the depressed part is formed by the following mechanism. When the light beam is radiated onto the lamination (which includes the resin layer, the intermediate layer, and the heat-absorbing layer), heat is generated in (i) the heat-absorbing layer and (ii) the layer made of dielectric material or metal oxide (intermediate layer). The heat is then transmitted to the resin layer. This softens the resin layer, because the temperature of the resin layer exceeds the glass transition temperature of the resin layer. In addition, due to the heat, water and air in the resin layer come out, or $O_2$ is generated from the ZnO film (intermediate layer). The water and air, or the $O_2$ push the softened resin aside. As a result, the depressed part is formed.

However, as a result of further diligent study, it was found that the heat-absorbing layer is not always necessary. Therefore, the inventors of the present invention supposed that the depressed part is formed by the following mechanism. When a light beam is radiated onto a lamination including (i) a resin layer and (ii) a depressed part inducing layer, which is made of dielectric material or metal oxide, heat is generated in the layer made of dielectric material or metal oxide (depressed part inducing layer). The heat is then transmitted to the resin layer. This softens the resin layer, because the temperature of the resin layer exceeds the glass transition temperature of the resin layer. In addition, due to the heat, water and air in the resin layer come out, or $O_2$ is generated from the ZnO film (depressed part inducing layer). The water and air, or the $O_2$ push the softened resin aside. As a result, the depressed part is formed. It is supposed that heat is associated with the formation of pits, because the pits are formed more uniformly if the heat-absorbing layer is provided.

Signals can be reproduced even from the optical recording medium master copy obtained as a result of the recording step, that is, the optical recording medium master copy still provided with the depressed part inducing layer. In addition, the resin layer is stable, and the depressed part is exposed when the depressed part inducing layer and the like are peeled off by using a solution to which the depressed part inducing layer and the like are soluble. From these facts, it is supposed that the depressed part is formed in the resin layer when the recording beam is radiated, and therefore, if the recording beam has been radiated onto a part of the resin layer, the part of the resin layer already has a depressed part.

The present invention is applicable to such uses as manufacturing an optical recording medium master copy used for manufacturing an optical recording medium (e.g. optical disk) in which information can be recorded at high density.

The method of the present invention for forming a micropattern may be such that the lamination is formed on a substrate from the side of the resin layer.

According to this arrangement, micropatterns (depressed parts) formed in the resin layer, i.e. micropatterns such as guiding grooves and prepits whose track pitch and pit pitch are smaller than the diameter of the light beam, are provided on the substrate. Therefore, even if resin is not appropriate as a material of the layer having the micropatterns, the micropatterns can be formed in an appropriate material for an intended purpose. For example, highly flat micropatterns can be formed if glass is used as the material of the substrate.

The method of the present invention for forming a micropattern may be such that the depressed part, which is formed in the resin layer, is transferred to the substrate by etching.

According to this arrangement, micropatterns (depressed parts) formed in the resin layer, i.e. micropatterns such as guiding grooves and prepits whose track pitch and pit pitch are smaller than the diameter of the light beam, are transferred to the substrate by etching. Therefore, even if resin is not appropriate as a material of the layer having the micropatterns, the micropatterns can be formed in an appropriate material for an intended purpose. For example, highly stable micropatterns can be formed by using glass as the material of the substrate and transferring micropatterns to the substrate.

The method of the present invention for forming a micropattern may be such that the resin layer is not completely removed in transferring the depressed part to the substrate by the etching, and a remaining part of the resin layer is peeled off the substrate after the etching is terminated.

According to this arrangement, the etching is terminated without completely removing the resin layer. Therefore, the surface of the substrate is not damaged by the etching. As a result, more flat micropatterns can be formed. Furthermore, because the depth of the substrate at the time of etching is the depth of the depressed part, there is also an advantage that the depth of the micropatterns can be set freely.

The method of the present invention for forming a micropattern may be such that anisotropic dry etching is performed in transferring the depressed part to the substrate.

With this arrangement, it is possible to maintain the size of the micropatterns excellently in transferring the micropatterns from the resin layer to the substrate.

The method of the present invention for forming a micropattern may be such that the light beam is radiated and focused onto the heat-absorbing layer from the side of the resin layer.

With this arrangement, as compared to the case where the light beam is radiated from the side of the heat-absorbing layer, the heat generated in the heat-absorbing layer is more easily transmitted to the depressed part inducing layer, which is made of dielectric material or metal oxide. In addition, because the light beam is transmitted through the depressed part inducing layer, the depressed part inducing layer generates heat by absorbing the light beam. Therefore, the shapes of the micropatterns formed in the resin layer are more uniform, and recording can be carried out at lower power.

The method of the present invention for forming a micropattern may be such that a metal layer is formed on the heat-absorbing layer; and the light beam is radiated and focused onto the heat-absorbing layer from the side of the resin substrate.

With this arrangement, the metal layer, which is provided on the heat-absorbing layer, blocks the explosion of the heat-absorbing layer. Therefore, the heat-absorbing layer does not explode. As a result, the micropatterns are formed in more uniform shapes. Furthermore, as in the foregoing arrangement, as compared to the case where the light beam is radiated from the side of the heat-absorbing layer, the heat generated in the heat-absorbing layer is more easily transmitted to the depressed part inducing layer, which is made of dielectric material or metal oxide. In addition, because the light beam is transmitted through the depressed part inducing layer, the depressed part inducing layer generates heat by absorbing the light beam. Therefore, the shapes of the micropatterns formed in the resin layer are more uniform, and recording can be carried out at lower power.

The method of the present invention for forming a micropattern may be such that the resin layer is made of photoresist, polyolefin resin, or the like, the depressed part inducing layer is made of zinc oxide, and the heat-absorbing layer is made of silicon.

With this arrangement, the method of the present invention for forming a micropattern can be carried out more easily.

The method of the present invention for manufacturing an optical recording medium master copy may be such that the resin layer, which is provided on the master copy substrate, is not completely removed in transferring the depressed part to the master copy substrate in the etching step; and a remaining part of the resin layer is removed in a second peeling step.

According to this arrangement, the surface of the master copy substrate is not damaged by the etching, because the etching is terminated without completely removing the resin layer. Therefore, the flatness of the surface of the master copy substrate is preserved. As a result, it is possible to manufacture an optical recording medium master copy having more flat micropatterns. Furthermore, because the depth of the master copy substrate at the time of etching is the depth of the depressed part, there is also an advantage that the depth of the micropatterns can be set freely.

The method of the present invention for manufacturing an optical recording medium master copy may be such that anisotropic dry etching is performed in the etching step, in order to transfer the depressed part to the master copy substrate.

With this arrangement, it is possible to maintain the size of the micropatterns excellently in transferring the micropatterns from the resin layer to the substrate.

The method of the present invention for manufacturing an optical recording medium master copy may be such that, in the film-forming step, a heat-absorbing layer is formed on the depressed part inducing layer; and, in the light radiating step, the light beam is radiated and focused onto at least the heat-absorbing layer, so as to form the depressed part in the resin substrate or the resin layer.

With this arrangement, as in the foregoing arrangement, an optical recording medium master copy having guiding grooves and prepits that are finer than those formed by a conventional method can be manufactured by using an existing laser recording device and by using a material that can be processed easily. Furthermore, by radiating and focusing the light beam onto the heat-absorbing layer in the light radiating step, heat is generated in the heat-absorbing layer, and the heat is transmitted to the depressed part inducing layer, which is made of dielectric material or metal oxide. As a result, it is possible to form an optical recording medium master copy having guiding grooves and prepits that are finer and more uniform in shape.

The method of the present invention for manufacturing an optical recording medium master copy may be such that, in the light radiating step, the light beam is radiated and focused onto the heat-absorbing layer from the side of the resin substrate or the resin layer.

With this arrangement, as compared to the case where the light beam is radiated from the side of the heat-absorbing layer, the heat generated in the heat-absorbing layer is more easily transmitted to the depressed part inducing layer, which is made of dielectric material or metal oxide. In addition, because the light beam is transmitted through the depressed part inducing layer, the depressed part inducing layer generates heat by absorbing the light beam. Therefore, the shapes of the micropatterns formed in the resin substrate or the resin layer are more uniform, and recording can be carried out at lower power.

The method of the present invention for manufacturing an optical recording medium master copy may be such that, in the film-forming step, a metal layer is formed on the heat-absorbing layer; and, in the light radiating step, the light beam is radiated and focused onto the heat-absorbing layer from the side of the resin substrate or the resin layer.

With this arrangement, the metal layer, which is provided on the heat-absorbing layer, blocks the explosion of the heat-absorbing layer. Therefore, because the heat-absorbing layer does not explode, the micropatterns are formed in more uniform shapes. As a result, the error rate is further reduced.

The method of the present invention for manufacturing an optical recording medium master copy may be such that the resin layer is made of photoresist, polyolefin resin, or the like, the depressed part inducing layer is made of zinc oxide, and the heat-absorbing layer is made of silicon. With this arrangement, it is possible to carry out the method of the present invention for manufacturing an optical recording medium master copy more easily, thereby obtaining an optical recording medium master copy.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a micropattern in a substrate, comprising the steps of:
   forming a lamination by laminating (i) a resin layer without photosensitivity and at least (ii) a depressed part inducing layer on the resin layer, which is made of zinc oxide, wherein the lamination is formed on the substrate from the side of the resin layer;
   selectively radiating and focusing a light beam onto at least the depressed part inducing layer of the lamination; wherein in the case where said selective radiating is to cause a depressed part to be formed in the resin layer, heat from the depressed part inducing layer from the selective radiating causes a latent image, comprising the depressed part, to be formed in the resin layer;
   etching the substrate while the resin layer is thereon; and
   wherein the depressed part formed in the resin layer is transferred to the substrate by the etching.

2. The method as set forth in claim 1, wherein:
   the resin layer is not completely removed in transferring the depressed part to the substrate by the etching, and said method further comprises the step of:
   removing a remaining part of the resin layer from the substrate after the etching is terminated.

3. The method as set forth in claim 1, wherein:
   the etching is anisotropic dry etching.

4. The method as set forth in claim 1, wherein:
   the resin layer is made of polyolefin resin.

5. The method as set forth in claim 1, further comprising the step of removing the depressed part inducing layer.

6. A method of forming a micropattern in a substrate, comprising the steps of:
   forming a lamination by laminating (i) a resin layer without photosensitivity, and at least (ii) a depressed part inducing layer, which is made of zinc oxide, and (iii) a heat-absorbing layer in this order; wherein the lamination is formed on the substrate from the side of the resin layer;
   selectively radiating and focusing a light beam onto the heat-absorbing layer of the lamination, wherein in the case where a depressed part is to be formed in the resin layer by said selectively radiating and focusing, the depressed part inducing layer in combination with the heat from the heat-absorbing layer causes a latent image, comprising the depressed part, to be formed in the resin layer;
   etching the substrate while the resin layer is thereon: and
   wherein the depressed part formed in the resin layer is transferred to the substrate by etching.

7. The method as set forth in claim 6, wherein:
   the resin layer is not completely removed in transferring the depressed part to the substrate by the etching, and wherein the method further comprises the step of:
   removing a remaining part of the resin layer from the substrate after the etching is terminated.

8. The method as set forth in claim 6, wherein:
   the etching is anisotropic dry etching.

9. The method as set forth in claim 6, wherein:
   the light beam is radiated and focused onto the heat-absorbing layer from the resin layer side of the lamination.

10. The method as set forth in claim 6, wherein:
    said forming a lamination includes laminating a metal layer on the heat-absorbing layer; and
    said selectively radiating and focusing further includes radiating and focusing the light beam onto at least the heat-absorbing layer from the side of the resin layer.

11. The method as set forth in any one of claims 6-10, wherein:
    the resin layer is made of polyolefin resin.

12. The method as set forth in any one of claims 6-10, wherein:
    the heat-absorbing layer is made of silicon.

13. The method as set forth in claim 6, further comprising the step of removing the depressed part inducing layer and the heat-absorbing layer.

14. A method of manufacturing an optical recording medium master copy, comprising:
    a film-forming step, in which at least (i) a resin layer without photosensitivity and (ii) a depressed part inducing layer, which is made of dielectric material or metal oxide, are formed in this order on a master copy substrate, which is made of inorganic material;

a light radiating step, in which a light beam is radiated and focused onto at least the depressed part inducing layer;

wherein in the case where a depressed part is to be formed in the resin layer by said light radiating step, the selective radiating onto the at least depressed part inducing layer causes a latent image, corresponding to the depressed part, to be formed in the resin layer; and an etching step, in which the depressed part in the resin layer, is transferred to the master copy substrate by etching.

15. The method as set forth in claim 14, wherein:
the inorganic material is glass, diamond, or sapphire.

16. A method as set forth in claim 14, wherein the resin layer is not completely removed during the etching step said method further comprising:

a post-etching removing step, in which a remaining part of the resin layer, the remaining part being that remaining on the master copy substrate after the etching step, is removed.

17. The method a set forth in claim 14, wherein:
anisotropic dry etching is performed in the etching step.

18. The method as set forth in claim 14, wherein:
in the film-forming step, a heat-absorbing layer is formed on the depressed part inducing layer; and in the light radiating step, the light beam is radiated and focused onto at least the heat-absorbing layer; and wherein in the case where a depressed part is to be formed in the resin layer by said light radiating step, the depressed part inducing layer in combination with the heat-absorbing layer causes the latent image corresponding to the depressed part, to be formed in the resin layer.

19. The method as set forth in claim 18, wherein:
in the light radiating step, the light beam is radiated and focused onto the heat-absorbing layer from the side of the resin layer.

20. The method as set forth in claim 18, wherein:
in the film-forming step, a metal layer is formed on the heat-absorbing layer; and in the light radiating step, the light beam is radiated and focused onto the heat-absorbing layer from the side of the resin layer.

21. The method as set forth in claim 18, wherein:
the heat-absorbing layer is made of silicon.

22. The method as set forth in claim 14, wherein:
the resin layer is made of polyolefin resin.

23. The method as set forth in claim 14, wherein:
the depressed part inducing layer is made of zinc oxide.

24. The method as set forth in claim 14, further comprising a pre-etching removing step, performed before said step of etching, in which each layer on the resin layer is removed so as to expose the depressed part.

25. The method as set forth in claim 16, further comprising a pre-etching removing step, performed before said step of etching, in which each layer on the resin layer is removed so as to expose the depressed part.

26. A method of forming a micropattern, comprising the steps of:

forming a lamination on a substrate by laminating (i) a resin layer without photosensitivity and at least (ii) a depressed part inducing layer on the resin layer, which is made of dielectric material or metal oxide;

selectively radiating and focusing a light beam onto at least the depressed part inducing layer of the lamination;

wherein in the case where a depressed part is to be formed in the resin layer by said selective radiating, the depressed part inducing layer in combination with heat from the heat-absorbing layer causes a latent image, comprising the depressed part, to be formed in the resin layer;

etching the substrate while the resin layer is thereon; and wherein the depressed part formed in the resin layer is transferred to the substrate by the etching.

27. The method as set forth in claim 26, wherein:
the depressed part inducing layer is made of zinc oxide.

28. A method of forming a micropattern, comprising the steps of:

forming a lamination on a substrate by laminating (i) a resin layer without photosensitivity, and at least (ii) a depressed part inducing layer, which is made of dielectric material or metal oxide, and (iii) a heat-absorbing layer in this order; and selectively radiating and focusing a light beam onto at least the heat-absorbing layer of the lamination;

wherein in the case where a depressed part is to be formed in the resin layer by said selectively radiating, the depressed part inducing layer in combination with heat from the heat-absorbing layer causes a latent image, comprising the depressed part, to be formed in the resin layer;

etching the substrate while the resin layer is thereon; and wherein the depressed part formed in the resin layer is transferred to the substrate by the etching.

29. The method as set forth claim 28, wherein:
the depressed part inducing layer is made of zinc oxide.

* * * * *

UNITED STATES PATENT AND TRADEMARK OFFICE
CERTIFICATE OF CORRECTION

| | | |
|---|---|---|
| PATENT NO. | : 7,618,768 B2 | |
| APPLICATION NO. | : 10/912028 | |
| DATED | : November 17, 2009 | |
| INVENTOR(S) | : Yamamoto et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 862 days.

Signed and Sealed this

Twenty-sixth Day of October, 2010

David J. Kappos
*Director of the United States Patent and Trademark Office*